US010663818B2

(12) United States Patent
Ohori

(10) Patent No.: US 10,663,818 B2
(45) Date of Patent: May 26, 2020

(54) ELECTRO-OPTIC DEVICE AND ELECTRONIC EQUIPMENT

(71) Applicant: SEIKO EPSON CORPORATION, Tokyo (JP)

(72) Inventor: Mitsutaka Ohori, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/037,999

(22) Filed: Jul. 17, 2018

(65) Prior Publication Data

US 2019/0033672 A1 Jan. 31, 2019

(30) Foreign Application Priority Data

Jul. 28, 2017 (JP) .................. 2017-146225

(51) Int. Cl.
*H01L 29/786* (2006.01)
*G02F 1/1362* (2006.01)
(Continued)

(52) U.S. Cl.
CPC ...... *G02F 1/136209* (2013.01); *G02F 1/1368* (2013.01); *G02F 1/133345* (2013.01); *G02F 1/133502* (2013.01); *G02F 1/134336* (2013.01); *G02F 1/136213* (2013.01); *G02F 1/136286* (2013.01); *H01L 27/124* (2013.01); *H01L 27/1218* (2013.01); *H01L 27/1222* (2013.01); *H01L 27/1248* (2013.01);
(Continued)

(58) Field of Classification Search
CPC ............. H01L 27/1262; H01L 27/1218; H01L 27/1248; H01L 27/124; H01L 27/1255; H01L 27/1222; H01L 29/78675; H01L 29/78621; H01L 29/78633
See application file for complete search history.

(56) References Cited

U.S. PATENT DOCUMENTS 4,282,270 A * 8/1981 Nozaki ............... H01L 21/3144
  438/769
6,344,888 B2 * 2/2002 Yasukawa ......... G02F 1/133553
  349/113
(Continued)

FOREIGN PATENT DOCUMENTS

JP       4075299 B2      4/2008
JP     2016-080956 A     5/2016

*Primary Examiner* — Kyoung Lee
*Assistant Examiner* — Christina A Sylvia
(74) *Attorney, Agent, or Firm* — Oliff PLC

(57) ABSTRACT

A liquid crystal panel of a liquid crystal device as an electro-optic device includes a recessed portion provided in a pixel in a base substrate, a scanning line as a first light-shielding layer and a data line as a second light-shielding layer provided on the base substrate, the scanning line and the data line being disposed sequentially from a base substrate side in a thickness direction of the base substrate with a space between the scanning line and the data line, in a thickness direction of the base substrate, a transistor provided between the scanning line and the data line, a first insulation layer covering the data line, and disposed along the recessed portion, and a second insulation layer being in contact with the first insulation layer, and having a refractive index n2 that is higher than a refractive index n1 of the first insulation layer.

5 Claims, 17 Drawing Sheets

(51) Int. Cl.
  *H01L 27/12*   (2006.01)
  *G02F 1/1333*  (2006.01)
  *G02F 1/1343*  (2006.01)
  *G02F 1/1335*  (2006.01)
  *G02F 1/1368*  (2006.01)
  G02F 1/137     (2006.01)
  G02F 1/1337    (2006.01)

(52) U.S. Cl.
  CPC ...... H01L 27/1255 (2013.01); H01L 27/1262 (2013.01); H01L 29/78621 (2013.01); H01L 29/78633 (2013.01); H01L 29/78675 (2013.01); *G02F 1/133504* (2013.01); *G02F 1/133734* (2013.01); *G02F 2001/13629* (2013.01); *G02F 2001/13685* (2013.01); *G02F 2001/13712* (2013.01); *G02F 2001/133742* (2013.01); *G02F 2001/136295* (2013.01); *G02F 2203/01* (2013.01)

(56) References Cited

U.S. PATENT DOCUMENTS

| | | | | |
|---|---|---|---|---|
| 2004/0141097 | A1* | 7/2004 | Takahara | G02F 1/136213 349/38 |
| 2004/0155244 | A1* | 8/2004 | Kawata | H01L 29/78633 257/59 |
| 2006/0215068 | A1* | 9/2006 | Nakagawa | G02F 1/136213 349/38 |
| 2013/0021542 | A1* | 1/2013 | Ito | G02F 1/133345 349/5 |
| 2014/0022480 | A1* | 1/2014 | Yokoyama | G02F 1/133345 349/43 |
| 2015/0207047 | A1* | 7/2015 | Amako | G02B 1/04 257/98 |
| 2016/0133655 | A1* | 5/2016 | Egami | H01L 27/1259 257/71 |

* cited by examiner

ELECTRO-OPTIC DEVICE AND ELECTRONIC EQUIPMENT

BACKGROUND

1. Technical Field

The disclosure relates to an electro-optic device and electronic equipment.

2. Related Art

An electro-optic device is an example of active matrix type liquid crystal device that includes transistors as switching elements assigned for individual pixels. Since liquid crystal devices are light receiving devices, an effective use of light that enter the pixels helps such devices to achieve higher contrasts, which will make displays easily viewable. Especially, liquid crystal devices used as optical modulation units of projection type display devices such as projectors tend to be smaller in pixel size due to small sizes of such liquid crystal devices. Hence, the light will be used even more efficiently than direct view type liquid crystal devices.

For example, JP-A-2016-80956 discloses an electro-optic device that satisfies a relationship of n3<n4, where n3 is a refractive index of a third interlayer insulation film in a non-opening region where a thin-film transistor is provided and n4 is a refractive index of a fourth interlayer insulation film that covers the third interlayer insulation film and that fills up an opening region. While the third interlayer insulation film and the fourth interlayer insulation film have different refractive indexes from each other as mentioned above, the interface between the third interlayer insulation film and the fourth interlayer insulation film forms a side wall surrounding the opening region. The light that has entered such a side wall is reflected by the side wall and led to the opening region side. To be specific, JP-A-2016-80956 discloses a possible, effective use of not only the light traveling straight along the optical axis of the opening region but also the light entering obliquely to the optical axis by making the side walls reflect the light and by prohibiting the light from diffusing.

The electro-optic device disclosed in JP-A-2016-80956, however, includes a third light-shielding layer arranged on top of the third interlayer insulation film, in a non-opening region. The light having entered an end portion of the third light-shielding layer is diffracted and then enters the third interlayer insulation film, and thus it may be difficult to lead such light to the opening region. Hence, improvement in use efficiency of the light having entered the opening region can be still considered. In addition, the light diffracted by the end portion of the third light-shielding layer may enter the thin-film transistor and may generate a photo leakage current, and may lead to a decrease in display quality.

Thus, as an example, to reduce the light entering the end portion of the third light-shielding layer, a configuration is conceivable where a recessed portion is formed in an opening region of a fourth interlayer insulation film covering a third light-shielding layer, then the recessed portion is filled up with an insulation film having a refractive index higher than the refractive index of the fourth interlayer insulation film, and the interface formed by the insulation film and the fourth interlayer insulation film is made to reflect the incident light. When a recessed portion is formed in an insulation film that covers structural objects such as a thin-film transistor and a light-shielding layer, the process condition for forming the recessed portion by an etching process, for example, may be restricted to prevent the structural objects from being damaged during the process. Hence, an angle made by a side portion of the recessed portion to be formed and a planar direction of a base substrate of an element substrate may fluctuate and the flatness of the surface of the side portion may be impaired. In addition, the structural objects are formed and then the recessed portion is formed. Therefore, a deviation tends to occur in the positional relationship between the recessed portion and the light-shielding layer. In such cases, the advantage of making the interface reflect the incident light may not be achievable.

SUMMARY

The disclosure implements the following exemplary embodiments or the following application examples.

Application Example 1

An electro-optic device according to Application Example 1 includes a recessed portion provided in an opening region of a pixel in a base substrate, a first light-shielding layer and a second light-shielding layer provided in a non-opening region for surrounding the opening region on the base substrate, the first light-shielding layer and the second light-shielding layer being disposed sequentially from a base substrate side in a thickness direction of the base substrate with a space between the first light-shielding layer and the second light-shielding layer, a transistor provided for each of the pixels between the first light-shielding layer and the second light-shielding layer, a first insulation layer provided across the opening region and the non-opening region, covering the second light-shielding layer, and disposed along the recessed portion, and a second insulation layer provided in the opening region and being in contact with the first insulation layer, and having a refractive index that is higher than a refractive index of the first insulation layer.

According to the configuration of Application Example 1, the first insulation layer is disposed along the recessed portion formed in the opening region, and the second insulation layer having a higher refractive index than the refractive index of the first insulation layer is formed to be in contact with the first insulation layer. Accordingly, as the light having entered obliquely the interface between the first insulation layer and the second insulation layer along the side portion of the recessed portion is reflected by the interface and is thus led to the inside of the opening region, the light having entered the opening region is used effectively. In addition, as the first insulation layer covers the second light-shielding layer formed in the non-opening region, the light traveling towards the end portion of the second light-shielding layer is also reflected by the interface between the first insulation layer and the second insulation layer. Hence, as light diffraction is less likely to happen at the end portion of the second light-shielding layer, a possible photo leakage current that may be caused by the entry of the diffracted light into the transistor is also reduced. In addition, as the formation of the recessed portion in the base substrate precedes the formation of the structures such as the first light-shielding layer, the transistor, and the second light-shielding layer, the recessed portion is formed under more favorable conditions than in the cases where the formation of these structures precedes the formation of the recessed portion in the base substrate. Accordingly, the side portion of the recessed portion is prevented from having a fluctuating angle and/or having a surface with impaired flatness, and deviation of the positional relationship between the recessed portion and the second light-shielding layer is prevented from occurring. As a result, an electro-optic device having a bright and excellent display quality is provided.

Application Example 2

An electro-optic device according to Application Example 2 includes a third insulation layer provided on a base substrate, a recessed portion provided in an opening region of a pixel in the third insulation layer, a first light-shielding layer and a second light-shielding layer provided in a non-opening region for surrounding the opening region on the third insulation layer, the first light-shielding layer and the second light-shielding layer being disposed sequentially from the third insulation layer side in a thickness direction of the third insulation layer with a space between the first light-shielding layer and the second light-shielding layer, a transistor provided for each of the pixels between the first light-shielding layer and the second light-shielding layer, a first insulation layer provided across the opening region and the non-opening region, covering the second light-shielding layer, and disposed along the recessed portion, and a second insulation layer provided in the opening region and being in contact with the first insulation layer, and having a refractive index that is higher than a refractive index of the first insulation layer.

According to the configuration of Application Example 2, the first insulation layer is disposed along the recessed portion formed in the opening region, and the second insulation layer having a higher refractive index than the refractive index of the first insulation layer is formed to be in contact with the first insulation layer. Accordingly, as the light having entered obliquely the interface between the first insulation layer and the second insulation layer along the side portion of the recessed portion is reflected by the interface and is thus led to the inside of the opening region, the light having entered the opening region is used effectively. In addition, as the first insulation layer covers the second light-shielding layer formed in the non-opening region, the light traveling towards the end portion of the second light-shielding layer is also reflected by the interface between the first insulation layer and the second insulation layer. Hence, as light diffraction is less likely to happen at the end portion of the second light-shielding layer, a possible photo leakage current that may be caused by the entry of the diffracted light into the transistor is also reduced. In addition, as the formation of the recessed portion in the third insulation layer precedes the formation of the structures such as the first light-shielding layer, the transistor, and the second light-shielding layer, the recessed portion is formed under more favorable conditions than in the cases where the formation of these structures precedes the formation of the recessed portion in the third insulation layer. Accordingly, the side portion of the recessed portion is prevented from having a fluctuating angle and/or having a surface with impaired flatness, and deviation of the positional relationship between the recessed portion and the second light-shielding layer is prevented from occurring. As a result, an electro-optic device having a bright and excellent display quality is provided.

Application Example 3

In the electro-optic device according to the above-described Application Example, a bottom portion of the second insulation layer may be provided on the base substrate side of the first light-shielding layer.

According to this configuration, a base substrate-side end of the interface between the first insulation layer and the second insulation layer along the side portion of the recessed portion is on the base substrate side of the first light-shielding layer. Hence, the light having entered the end portion of the first light-shielding layer from the base substrate side is reflected, at a side portion of the recessed portion, by the interface between the first insulation layer and the second insulation layer to the opening-region side. Accordingly, when the light enters from the base substrate side, the light having entered the opening region is used effectively, and a photo leakage current that would be caused by the light having been diffracted at the end portion of the first light-shielding layer and entered the transistor is prevented from occurring.

Application Example 4

In the electro-optic device according to the above-described Application Example, a film thickness of the first insulation layer at a side portion of the recessed portion may be equal to or smaller than a film thickness of the first insulation layer at a bottom portion of the recessed portion.

As the first insulation layer that is too thick at the side portion of the recessed portion makes the interface between the first insulation layer and the second insulation layer too remote from the non-opening region and reduces the light reflected by the interface, the efficiency of using the light having entered the opening region is impaired and becomes more susceptible to the diffraction of light at the end portion of the second light-shielding layer. According to this configuration, an intended efficiency of using light is accomplished by forming the first insulation layer at the side portion of the recessed portion to have a thickness that is not larger than the thickness of the first insulation layer at the bottom portion of the recessed portion.

Application Example 5

In the electro-optic device according to the above-described Application Example, the second insulation layer may include a layer having a refractive index that decreases in a stepwise manner according to a distance from the base substrate in a thickness direction.

According to this configuration, the second insulation layer has a layer where, within the recessed portion, the refractive index becomes smaller with the distance in the thickness direction from the base substrate. Hence, even if, for example, a different insulation layer having a smaller refractive index than the refractive index of the second insulation layer is formed on top of the second insulation layer, the reflection by the interface between the portion of the second insulation layer that has a reduced refractive index and the different insulation layer is reduced. Accordingly, the reflection, by the interface, of the light having entered the opening region is reduced and a more effective use of the incident light is accomplished.

Application Example 6

Electronic equipment according to Application Example 6 may include an electro-optic device of the above-described Application Example.

According to the configuration of Application Example 6, the light passing through the opening region of the pixel is used effectively for the display, and, as a result, electronic equipment having a bright and excellent display quality is provided.

Application Example 7

A method for producing an electro-optic device according to Application Example 7 includes providing a metal mask in a non-opening region for surrounding an opening region of a pixel in a base substrate, forming a recessed portion in the opening region in the base substrate by using the metal mask, forming a first light-shielding layer in the non-opening region over the base substrate, forming a transistor for each of the pixels on top of the first light-shielding layer in the non-opening region, forming a second light-shielding layer on top of the transistor in the non-opening region, forming a first insulation layer across the opening region and the non-opening region to cover the second light-shielding layer and to extend along the recessed portion, forming a second insulation layer having a refractive index that is higher than a refractive index of the first insulation layer to cover the first insulation layer, and planarizing a surface of the second insulation layer and removing the second insulation layer in the non-opening region.

According to the method for producing of Application Example 7, the first insulation layer is formed along the recessed portion formed in the opening region, and the second insulation layer that has a higher refractive index than the refractive index of the first insulation layer is formed to cover the first insulation layer. Accordingly, as the light having entered obliquely the interface between the first insulation layer and the second insulation layer along the side portion of the recessed portion is reflected by the interface and is thus led to the inside of the opening region, the light having entered the opening region is used effectively. In addition, as the first insulation layer covers the second light-shielding layer formed in the non-opening region, the light traveling towards the end portion of the second light-shielding layer is also reflected by the interface between the first insulation layer and the second insulation layer. Hence, as light diffraction is less likely to happen at the end portion of the second light-shielding layer, a possible photo leakage current that may be caused by the entry of the diffracted light into the transistor is also reduced. In addition, as the formation of the recessed portion in the base substrate precedes the formation of the structures such as the first light-shielding layer, the transistor, and the second light-shielding layer, the recessed portion is formed under more favorable conditions by using a metal mask than in the cases where the formation of these structures precedes the formation of the recessed portion in the base substrate. Accordingly, the side portion of the recessed portion is prevented from having a fluctuating angle and/or having a surface with impaired flatness, and deviation of the positional relationship between the recessed portion and the second light-shielding layer is prevented from occurring. As a result, an electro-optic device having a bright and excellent display quality is produced.

Application Example 8

A method for producing the electro-optic device according to Application Example 8 includes a forming a third insulation layer on a base substrate, providing a metal mask in a non-opening region for surrounding an opening region of a pixel in the third insulation layer, forming a recessed portion in the opening region in the third insulation layer by using the metal mask, forming a first light-shielding layer in the non-opening region over the third insulation layer, forming a transistor for each of the pixels on top of the first light-shielding layer in the non-opening region, forming a second light-shielding layer on top of the transistor in the non-opening region, forming a first insulation layer across the opening region and the non-opening region to cover the second light-shielding layer and to extend along the recessed portion, forming a second insulation layer having a refractive index that is higher than a refractive index of the first insulation layer to cover the first insulation layer, and planarizing a surface of the second insulation layer and removing the second insulation layer in the non-opening region.

According to the method for producing of Application Example 8, the first insulation layer is formed along the recessed portion formed in the opening region, and the second insulation layer that has a higher refractive index than the refractive index of the first insulation layer is formed to cover the first insulation layer. Accordingly, as the light having entered obliquely the interface between the first insulation layer and the second insulation layer along the side portion of the recessed portion is reflected by the interface and is thus led to the inside of the opening region, the light having entered the opening region is used effectively. In addition, as the first insulation layer covers the second light-shielding layer formed in the non-opening region, the light traveling towards the end portion of the second light-shielding layer is also reflected by the interface between the first insulation layer and the second insulation layer. Hence, as light diffraction is less likely to happen at the end portion of the second light-shielding layer, a possible photo leakage current that may be caused by the entry of the diffracted light into the transistor is also reduced. In addition, as the formation of the recessed portion in the third insulation layer formed on the base substrate precedes the formation of the structures such as the first light-shielding layer, the transistor, and the second light-shielding layer, the recessed portion is formed under more favorable conditions by using a metal mask than in the cases where the formation of these structures precedes the formation of the recessed portion in the third insulation layer. Accordingly, the side portion of the recessed portion is prevented from having a fluctuating angle and/or having a surface with impaired flatness, and deviation of the positional relationship between the recessed portion and the second light-shielding layer is prevented from occurring. As a result, an electro-optic device having a bright and excellent display quality is produced.

Application Example 9

In the method for producing the electro-optic device according to the above-described Application Example, in the forming of the first insulation layer, the first insulation layer may be formed to have a film thickness at a bottom portion of the recessed portion that is smaller than a depth of the recessed portion.

According to this method for producing, the thickness of the first insulation layer at the bottom portion of the recessed portion is smaller than the depth of the recessed portion, and, as a result, the bottom portion of the second insulation layer that covers the first insulation layer is on the base substrate side of the first light-shielding layer. Accordingly, a base substrate-side end of the interface between the first insulation layer and the second insulation layer along the side portion of the recessed portion is on the base substrate side of the first light-shielding layer. Hence, the light having entered the end portion of the first light-shielding layer from the base substrate side is reflected, at a side portion of the recessed portion, by the interface between the first insulation layer and the second insulation layer to the opening-region side. Accordingly, when the light enters from the base substrate side, the light having entered the opening region is used effectively, and a photo leakage current that would be caused by the light having been diffracted at the end portion of the first light-shielding layer and entered the transistor is prevented from occurring.

Application Example 10

In the method for producing the electro-optic device according to the above-described Application Example, in the forming of the first insulation layer, the first insulation layer may be formed to have a film thickness at a side portion of the recessed portion that is equal to or smaller than a film thickness at a bottom portion of the recessed portion.

As the first insulation layer that is too thick at the side portion of the recessed portion makes the interface between the first insulation layer and the second insulation layer too remote from the non-opening region and reduces the light reflected by the interface, the efficiency of using the light having entered the opening region is impaired and becomes more susceptible to the diffraction of light at the end portion of the second light-shielding layer. According to this method for producing, an intended efficiency of using light is accomplished by forming the first insulation layer at the side portion of the recessed portion to have a thickness that is not larger than the thickness of the first insulation layer at the bottom portion of the recessed portion.

Application Example 11

In the method for producing the electro-optic device according to the above-described Application Example, in the forming of the second insulation layer, the second insulation layer may be formed to include a layer having a refractive index decreases in a stepwise manner according to a distance from the base substrate in a thickness direction.

According to this method for producing, the second insulation layer is formed to include a layer where, within the recessed portion, the refractive index becomes smaller with the distance in the thickness direction from the base substrate. Hence, even if, for example, a different insulation layer having a smaller refractive index than the refractive index of the second insulation layer is formed on top of the second insulation layer, the reflection by the interface between the portion of the second insulation layer that has a reduced refractive index and the different insulation layer is reduced. Accordingly, the reflection, by the interface, of the light having entered the opening region is reduced and an effective use of the incident light is accomplished.

Application Example 12

In the method for producing the electro-optic device according to the above-described Application Example, in the forming of the first light-shielding layer, the metal mask provided in the non-opening region in a process of forming the recessed portion may be used as the first light-shielding layer.

According to this method for producing, the metal mask to form the recessed portion is the first light-shielding layer, that is, the first light-shielding layer is used as the metal mask, and, as a result, the accuracy of alignment between the first light-shielding layer and the recessed portion is improved.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Figure 1:
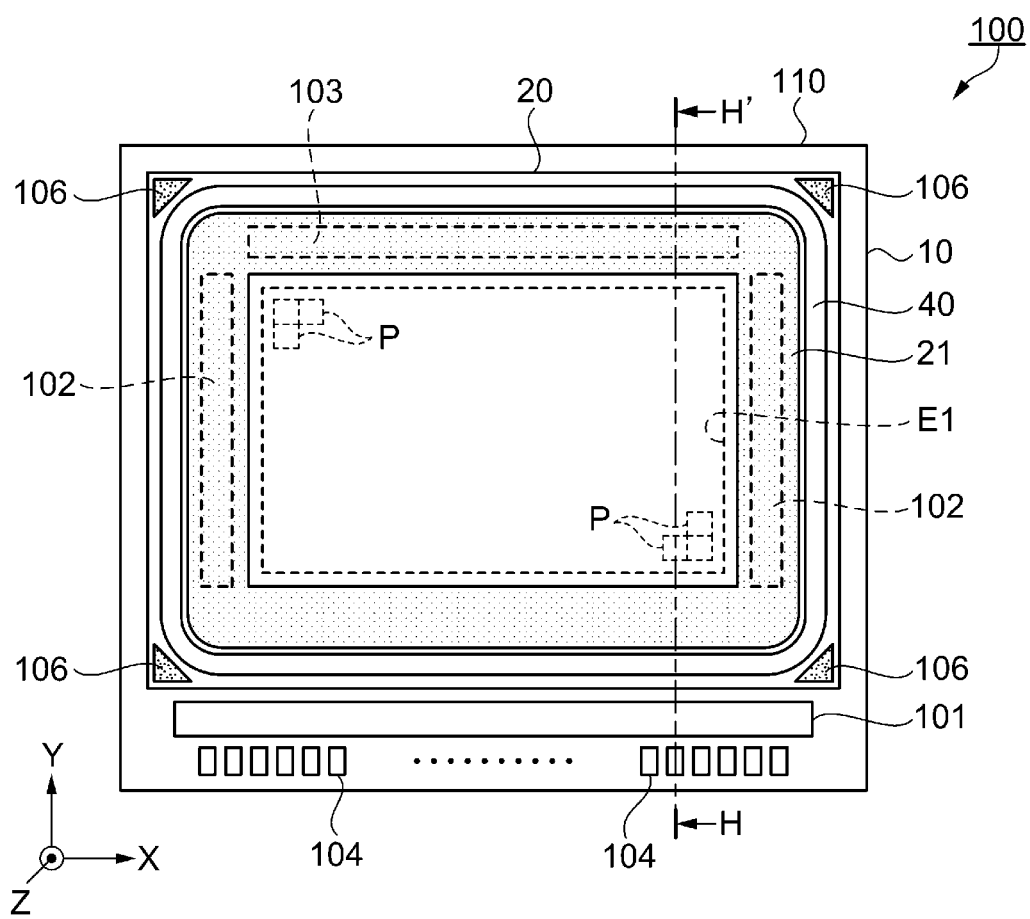
FIG. 1 is a schematic plan view illustrating a configuration of a liquid crystal device as an electro-optic device of the first exemplary embodiment.

Some exemplary embodiments will be described below by referring to the drawings. The drawings to be used are scaled as appropriate for the described parts described to be easily recognizable.

In some exemplary embodiments, an active matrix type liquid crystal device including thin-film transistors (TFTs) serving as switching elements to individual pixels will be described as an electro-optic device, for example. The liquid crystal device can be used, for example, as an optical modulation device (liquid crystal light valve) of a projection-type display apparatus (liquid crystal projector), which will be described later.

First Exemplary Embodiment

Electro-Optic Device

Figure 2:
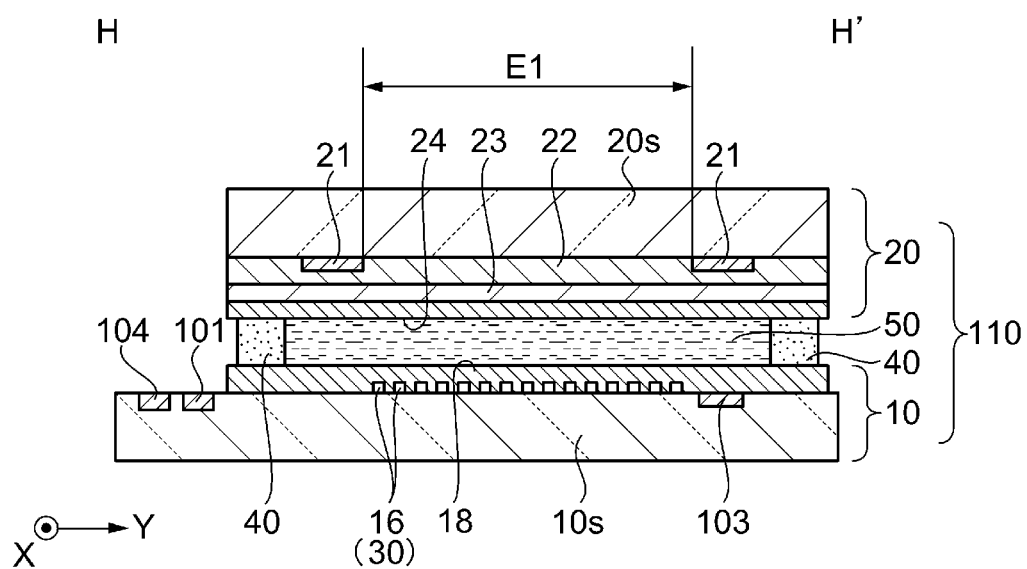
FIG. 2 is a schematic cross-sectional diagram illustrating a structure of the liquid crystal device taken along the line H-H' of FIG. 1.
Figure 3:
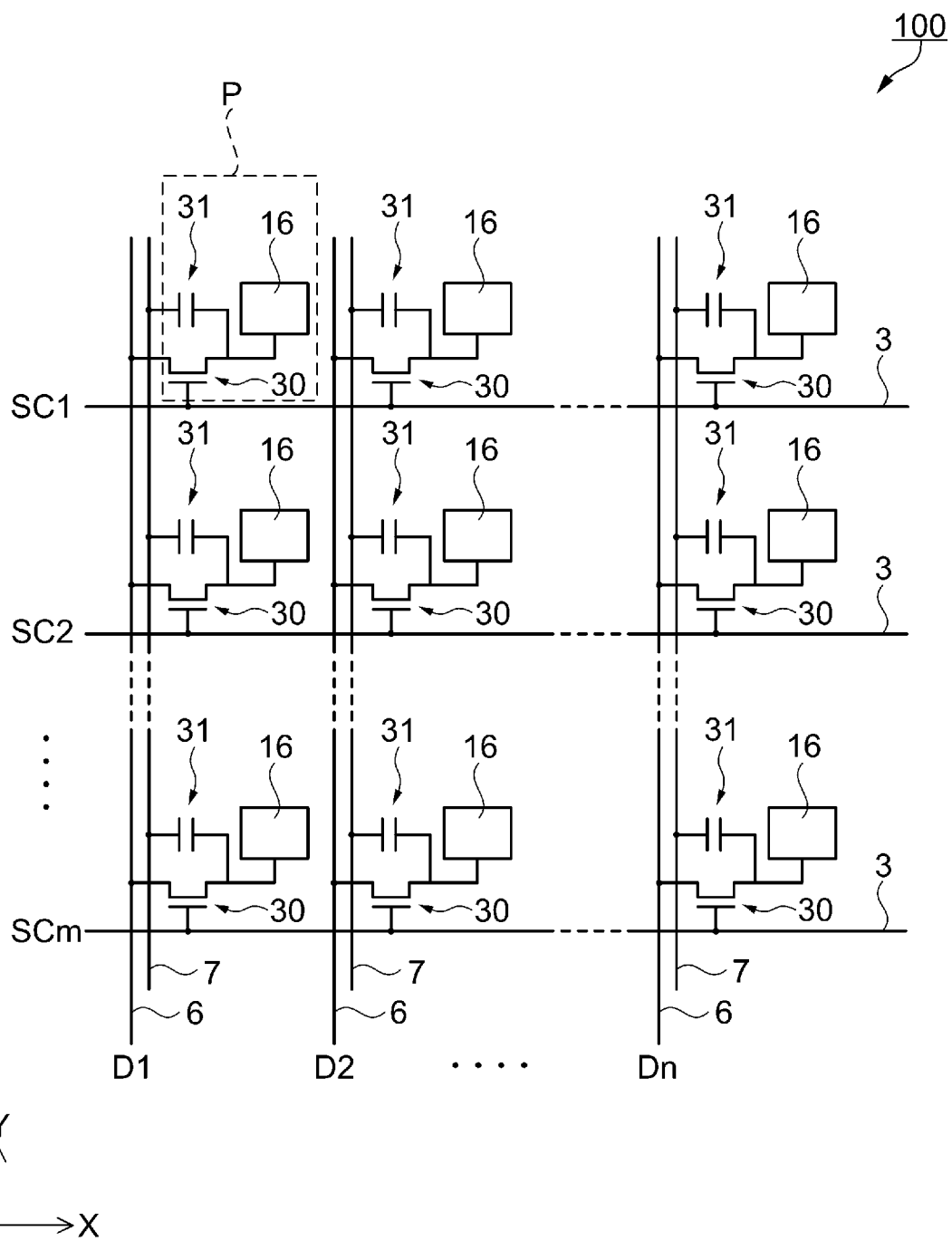
FIG. 3 is an equivalent circuit diagram illustrating an electrical configuration of the liquid crystal device.

To begin with, a liquid crystal device as an electro-optic device of a first exemplary embodiment will be described by referring to FIG. 1 to FIG. 3. FIG. 1 is a schematic plan view illustrating a configuration of the liquid crystal device as an electro-optic device in a first exemplary embodiment. FIG. 2 is a schematic cross-sectional diagram illustrating a structure of the liquid crystal device taken along the line H-H' of FIG. 1. FIG. 3 is an equivalent circuit diagram illustrating an electrical configuration of the liquid crystal device.

As illustrated in FIG. 1 and FIG. 2, a liquid crystal device 100 as an electro-optic device of the first exemplary embodiment includes a liquid crystal panel 110. The liquid crystal panel 110 includes an element substrate 10 and a counter substrate 20, which are disposed to face each other, and a liquid crystal layer 50, which is sandwiched between such a pair of substrates 10 and 20. For example, transparent quartz substrates or transparent glass substrates are used for a base substrate 10s of the element substrate 10 and a base substrate 20s of the counter substrate 20.

The element substrate 10 is larger than the counter substrate 20, and the two substrates 10 and 20 are bonded together with a certain space between these substrates 10 and 20, with a sealing portion 40, which is disposed along an outer edge of the counter substrate 20, being interposed between the substrates 10 and 20. Liquid crystal is filled in the sealing portion 40 disposed in shape like a picture frame to constitute the liquid crystal layer 50. A method for filling liquid crystal into the above-mentioned space includes a One Drop Fill (ODF) method of dropping liquid crystal into the sealing portion 40 disposed in shape like a picture frame and then bonding the element substrate 10 and the counter substrate 20 together under reduced pressure.

Adhesives such as thermosetting or ultraviolet-curable epoxy resins are used for the sealing portion 40. An ultraviolet curable epoxy resin is used for this purpose in the first exemplary embodiment. A spacer (not illustrated) is mixed in the sealing portion 40 to keep the above-described certain space between a pair of substrates.

A display area E1, including a plurality of pixels P arranged in a matrix are disposed in the sealing portion 40. In addition, a parting portion 21, having a light shielding characteristic, surrounds the display area E1 between the sealing portion 40 and the display area E1. The parting portion 21 includes, for example, metal or metal oxide each having a light shielding characteristic. The display area E1 may include not only effective pixels P, which are capable of contributing to displaying but also a plurality of dummy pixels that surround the effective pixels P.

A terminal portion where a plurality of external connection terminals 104 are arranged in the element substrate 10. A data line driving circuit 101 is provided between a first side portion that is located along the terminal portion, and the sealing portion 40. In addition, an inspecting circuit 103 is provided between the sealing portion 40, which is located along a second side portion that is opposite the first side portion, and the display area E1. Furthermore, scanning line driving circuits 102 are each provided between the sealing portion 40, which are located along a third side portion, and the display area E1, and between the sealing portion 40, which are located along a fourth side portion, and the display area E1. The third side portion and the fourth side portion are orthogonal to the first side portion and opposite each other. A plurality of interconnections (not illustrated) to connect the two scanning line driving circuits 102 are provided between the sealing portion 40, which is located along the second side portion, and the inspecting circuit 103.

Interconnections (not illustrated) to be connected with the data line driving circuit 101 and the scanning line driving circuits 102 are connected with the plurality of external connection terminals 104, which are arranged along the first side portion. The disposition of the inspecting circuit 103 is not limited to the above-described disposition, and may be disposed along the inner side of the sealing portion 40 between the data line driving circuit 101 and the display area E1.

Hereinafter, the direction along the first side portion is referred to as X direction, and the direction along the third side portion is referred to as Y direction. In addition, viewing the liquid crystal device 100 in a direction from the counter substrate 20 side to the element substrate 10 side is referred to as the "planar view" or "planarly".

As illustrated in FIG. 2, light transmissive pixel electrodes 16 provided individually for pixels P, thin-film transistors (hereinafter, referred to as TFTs) 30 serving as switching elements, signal wiring, and an alignment film 18 are formed on a surface on the liquid crystal layer 50 side of the element substrate 10. The alignment film 18 is provided for covering the pixel electrodes 16, the TFTs 30, and the signal wiring. The element substrate 10 includes the base substrate 10s, the pixel electrodes 16, the TFTs 30, the signal wiring, and the alignment film 18, which are formed on top of the base substrate 10s. Detailed configuration of the element substrate 10 will be described later.

The counter substrate 20 that is disposed opposite the element substrate 10 includes the base substrate 20s, the parting portion 21 formed on the base substrate 20s, a planarization layer 22 formed to cover the parting portion 21, a counter electrode 23 covering the planarization layer 22, formed almost all over the base substrate 20s, and serving as a common electrode, and an alignment film 24 covering the counter electrode 23.

As illustrated in FIG. 1, the parting portion 21 is formed at a position to surround the display area E1 and to planarly overlap the scanning line driving circuit 102 and the inspecting circuit 103. The parting portion 21 functions to block the light that may enter the circuits 102 and 103 from the counter substrate 20 side and thus to prevent the malfunctions of these circuits 102 and 103 from being caused by such incident light. In addition, the parting portion 21 blocks unnecessary stray light that may enter the display area E1, and thus secures a high-contrast display realized by the display area E1.

As the sealing portion 40 in the first exemplary embodiment is includes an ultraviolet-curable epoxy resin, the parting portion 21 is disposed not to overlap the sealing portion 40 in a planar view. Hence, a slight gap is arranged between the parting portion 31 and the sealing portion 40 (see FIG. 1) in consideration of the alignment accuracy in bonding the element substrate 10 and the counter substrate 20 together and the ultraviolet curability of the sealing portion 40.

The planarization layer 22 includes an inorganic material such as silicon oxide, has a light transmissive characteristic, and is formed to cover the parting portion 21. A method of forming such a planarization layer 22 includes, for example, a method of forming films using the plasm CDV technique.

The counter electrode 23 is formed with a transparent conductive film including, for example, indium tin oxide (ITO), covers the planarization layer 22, and is electrically connected to vertically conducting portions 106 respectively provided at four corners of the counter substrate 20, as illustrated in FIG. 1. The vertically conducting portions 106 are electrically connected to wiring of the element substrate 10.

The alignment film 18 for covering the pixel electrodes 16 and the alignment film 24 for covering the counter electrode 23 are selected based on optical designs of the liquid crystal device 100. Examples of alignment films 18 and 24 may include an organic alignment film produced by forming a film of an organic material such as polyimide and then rubbing the surface of the film to provide substantially horizontal orientation processing to liquid crystal molecules having a positive dielectric anisotropy, and an inorganic alignment film produced by forming a film of an inorganic material such as silicon oxide ($SiO_x$) in a vapor phase growth method to provide substantially vertical orientation processing to liquid crystal molecules having negative dielectric anisotropy.

The liquid crystal device 100 configured as described above is of a transmissive type and adopts an optical design of a normally white mode in which the pixels P have the maximum transmissivity when no voltage is applied, or a normally black mode in which the pixels P have the minimum transmissivity when no voltage is applied. Polarizing elements are disposed, in accordance with the optical design, on the light-entry side and light-exit side of the liquid crystal panel 110, including both the element substrate 10 and the counter substrate 20.

Hereinafter, in the first exemplary embodiment, a description will be given of an example in which the above-described inorganic alignment films are used as the alignment films 18 and 24, liquid crystal having the negative dielectric anisotropy is used, and an optical design of the normally black mode is applied.

Next, referring to FIG. 3, an electrical configuration of the liquid crystal device 100 (liquid crystal panel 110) will be described. The liquid crystal device 100 includes a plurality of scanning lines 3, a plurality of data lines 6, and capacitance lines 7. The lines 3 and 6, both serving as signal wiring, are insulated from each other at least in the display area E1, and are orthogonal to each other. The capacitance lines 7 are disposed in parallel to data lines 6. The direction in which the scanning lines 3 extend is X direction and the direction in which the data lines 6 extend is Y direction.

A pixel electrode 16, a TFT 30, and a storage capacitance 31 are provided in a region segmented by the signal lines such as the scanning line 3, the data line 6, and the capacitance line 7, and constitutes a pixel circuit of a pixel P.

The scanning line 3 is electrically connected to the gate of TFT 30, and the data line 6 is electrically connected to the source of TFT 30. The pixel electrode 16 is electrically connected to the drain of the TFT 30.

The data lines 6 are connected to the data line driving circuit 101 (see FIG. 1) and supply, to the pixels P, image signals D1, D2, . . . , and Dn, which are supplied from the data line driving circuit 101. The scanning lines 3 are connected to the scanning line driving circuits 102 (see FIG. 1), and supply, to the pixels P, scanning signals SC1, SC2, . . . , and SCm, which are supplied from the scanning line driving circuits 102.

The image signals D1 to Dn, which are supplied from the data line driving circuit 101 to the data lines 6, may be supplied in this order in a line-sequential manner, or may be supplied to every group by grouping a plurality of data lines 6, which are adjacent one another. The scanning line driving circuits 102 supply the scanning signals SC1 to SCm to the scanning lines 3 at predetermined timings in a pulse and in a line-sequential manner.

The liquid crystal device 100 is configured such that inputs of the scanning signals SC1 to SCm turn on the TFTs 30 serving as the switching elements only for a certain period of time, and thus the image signals D1 to Dn to be supplied from the data lines 6 are respectively written into the pixel electrodes 16 at predetermined timings. Then, the image signals D1 to Dn, with a predetermined level, having been written into the liquid crystal layer 50 through the pixel electrodes 16 are held, for a certain period of time, between the pixel electrodes 16 and the counter electrode 23 disposed opposite the pixel electrodes 16 with the liquid crystal layer 50 interposed between the image electrodes 16 and the counter electrode 23. The image signals D1 to Dn have a frequency of 60 Hz, for example.

To prevent the held image signals D1 to Dn from leaking, the storage capacitance 31 is connected in parallel to a liquid crystal capacitance generated between the pixel electrodes 16 and the counter electrode 23. The storage capacitance 31 is provided between the drain of the TFT 30 and the capacitance line 7.

The data lines 6 are connected to the inspecting circuit 103 illustrated in FIG. 1. This configuration enables a faulty operation of the liquid crystal device 100 to be checked by detecting the above-described image signal in the production process of the liquid crystal device 100. However, such a configuration is omitted in the equivalent circuit of FIG. 3.

Peripheral circuits used for controlling the driving of the pixel circuits in the first exemplary embodiment include the data line driving circuit 101, the scanning line driving circuits 102, and the inspecting circuit 103. In addition, the peripheral circuits may include a sampling circuit configured to sample an image signal and to supply the sampled signal to the data line 6, and a precharge circuit configured to supply a precharge signal with a predetermined voltage level to the data line 6 before the image signal is supplied.

Pixel Structure

Figure 4:
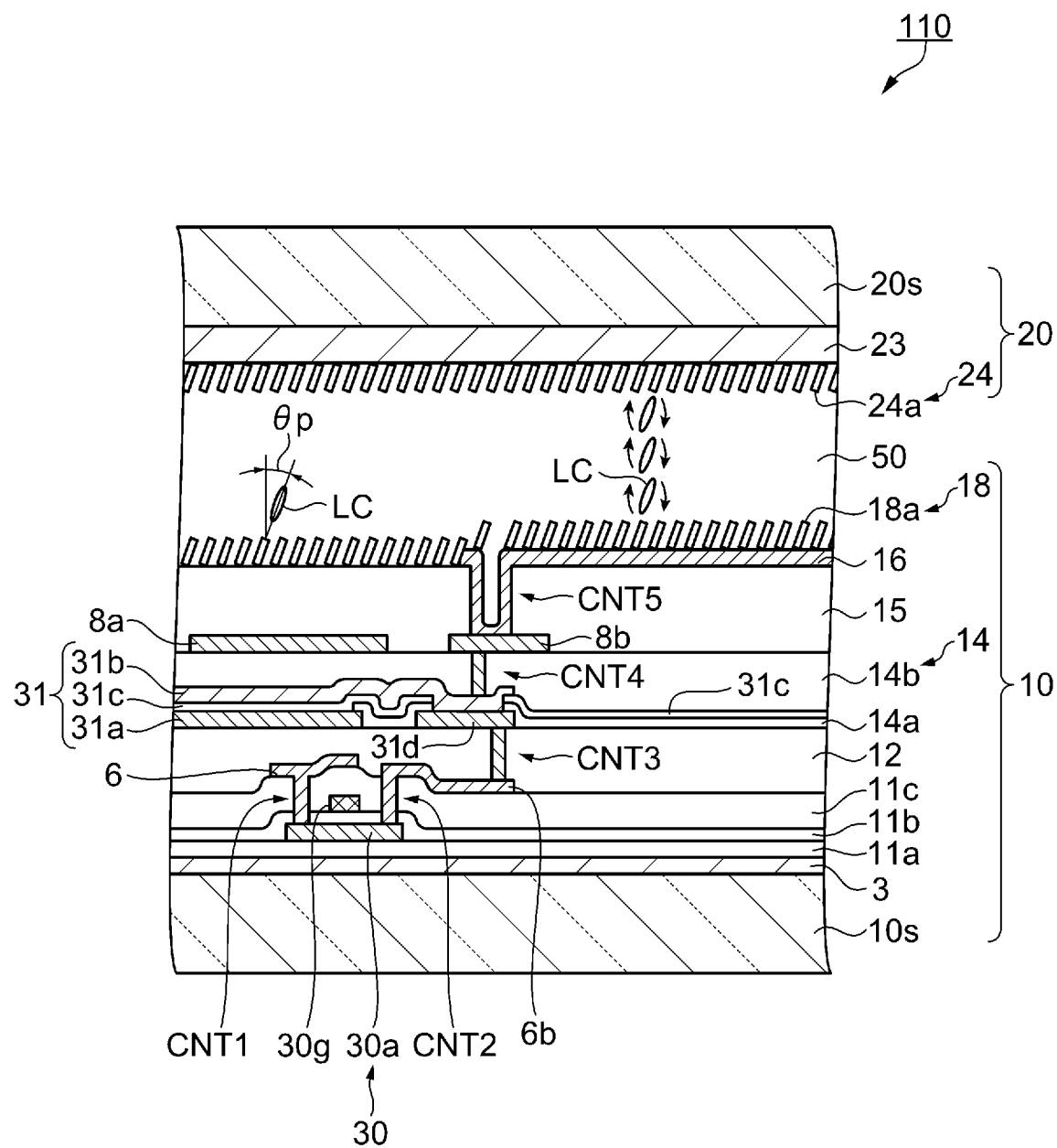
FIG. 4 is a schematic cross-sectional diagram illustrating a structure of a non-opening region of the liquid crystal device.

Next, a structure of the pixel P included in the liquid crystal device 100 (liquid crystal panel 110) of the first exemplary embodiment will be described. The liquid crystal device 100 (liquid crystal panel 110) includes opening regions for the pixels P and a non-opening region surrounding the opening region. FIG. 4 is a schematic cross-sectional diagram illustrating a structure of a non-opening region of the liquid crystal device.

As illustrated in FIG. 4, the scanning lines 3 are formed on the base substrate 10s of the element substrate 10. The scanning lines 3 may be formed by using a simple metal substance, alloy, metal silicide, metal polysilicide, metal nitride, which includes at least one of metals such as titanium (Ti), chromium (Cr), tungsten (W), tantalum (Ta), molybdenum (Mo). Alternatively, a laminate of these materials may also be used. The scanning lines 3 have a light-shielding characteristic. The scanning lines 3 are an example of a first light-shielding layer of the disclosure.

An underlying insulation film 11a including, for example, silicon oxide is formed to over the scanning lines 3, and semiconductor layers 30a having an island shape are formed on top of the underlying insulation film 11a. The semiconductor layers 30a includes, for example, polycrystalline silicon films, and each of the semiconductor layers 30a has a lightly doped drain (LDD) structure that is formed by implantation of impurity ions and that includes a first source-drain region, a junction region, a channel region, a junction region, and a second source-drain region.

As the semiconductor layers 30a are formed on the upper side of the light-shielding scanning lines 3, the semiconductor layers 30a are shielded from the light that may enter the semiconductor layers 30a from the base substrate 10s side. Accordingly, optical malfunctions of the TFTs 30 caused by such incident light are prevented.

A gate insulation film 11b is formed to cover the semiconductor layers 30a. In addition, gate electrodes 30g are each formed on a location facing the channel region with the gate insulation film 11b interposed between the gate electrode 30g and the semiconductor layer 30a.

A first interlayer insulation film 11c is formed to cover the gate electrodes 30g and the gate insulation film 11b. Two contact holes CNT1 and CNT2 are formed, penetrating through both the gate insulation film 11b and the first interlayer insulation film 11c, at locations respectively overlapping the two end portions of each of the semiconductor layer 30a.

Then, a light-shielding conductive film including, for example, aluminum (Al), an aluminum alloy, or a metallic compound is formed to fill in the two contact holes CNT1 and CNT2 and to cover the first interlayer insulation film 11c. By patterning the conductive film, the data lines 6 are formed, each connecting to the first source-drain region via the contact hole CNT1. At the same time, first relay electrodes 6b are formed, each connecting to the second source-drain region via the contact hole CNT2. The data lines 6 and the first relay electrodes 6b are examples of a second light-shielding layer of the disclosure.

Then, a second interlayer insulation film 12 is formed to cover the data lines 6, the first relay electrodes 6b, and the first interlayer insulation film 11c. The second interlayer insulation film 12 includes, for example, a silicon oxide. Then, a planarization treatment is performed to planarize the irregular surface produced by covering the regions where TFTs 30 are located. Examples of the planarization treatment method include a Chemical Mechanical Polishing (CMP) treatment, and a spin coating treatment.

Contact holes CNT3 that penetrate through the second interlayer insulation film 12 are each formed at a location overlapping the first relay electrode 6b. Then, a light-shielding conductive film made from, for example, aluminum (Al), an aluminum alloy, or a metallic compound is formed to coat the contact holes CNT3 and to cover the second interlayer insulation film 12. By patterning the conductive film that has been formed, first capacitance electrodes 31a and second relay electrodes 31d are formed.

An insulation film 14a is patterned and formed to cover the outer edge of a portion of the first capacitance electrode 31a through a dielectric layer 31c to be formed later, the portion being positioned to face the second capacitance electrode 31b. In addition, the insulation film 14a is patterned and formed to cover the outer edge of the second relay electrode 31d except the portion overlapping a contact hole CNT4, in the second relay electrode 31d. The insulation film 14a is provided to prevent the first capacitance electrodes 31a from being etched during the patterning the second capacitance electrodes 31b to be formed at a later process.

Then, the dielectric layer 31c is formed to cover the insulation film 14a and the first capacitance electrodes 31a. Examples of films that may be used as the dielectric layer 31c include a single-layer film of silicon nitride, hafnium oxide ($HfO_2$), alumina ($Al_2O_3$), tantalum oxide ($Ta_2O_5$), and a multiple-layer film which is formed by laminating at least two kinds of such single-layer films. The dielectric layer 31c that planarly overlap the second relay electrodes 31d are removed by etching. A conductive film of, for example, titanium nitride (TiN) is formed to cover the dielectric layer 31c. By patterning such a conductive film, the second capacitance electrodes 31b are formed to be disposed respectively facing the first capacitance electrodes 31a and to respectively connect to the second relay electrodes 31d.

The storage capacitance 31 is formed including the dielectric layer 31c, the first capacitance electrode 31a and the second capacitance electrode 31b, with the dielectric layer 31c interposed between the first capacitance electrode 31a and the second capacitance electrode 31b. As the first capacitance electrodes 31a and the second capacitance electrodes 31b are made of light-shielding conductive films, the storage capacitances 31 each have a light-shielding property. In a case where the scanning lines 3 are each considered as a first light-shielding layer and the data lines 6 are each considered as a second light-shielding layer, the storage capacitances 31 each correspond to a third light-shielding layer.

Then, a third interlayer insulation film 14b is formed to cover the second capacitance electrodes 31b and the dielectric layer 31c. The third interlayer insulation film 14b also includes, for example, silicon oxide. The third interlayer insulation film 14b is subjected to a planarization treatment such as a CMP treatment. The insulation film 14a and the dielectric layer 31c are smaller in thicknesses than the third interlayer insulation film 14b. In addition, the insulation film 14a and the dielectric layer 31c may not necessarily formed across the entire surface of the base substrate 10s, but may be patterned for the configuration of the storage capacitance 31. Accordingly, hereinafter, in the first exemplary embodiment, the interlayer insulation film covering the storage capacitances 31 will be considered as a third interlayer insulation film 14.

Contact holes CNT4 are each formed penetrating through the third interlayer insulation film 14 to reach a part of the second capacitance electrode 31b, such a part being in contact with the second relay electrode 31d.

A light-shielding conductive film of, for example, aluminum (Al), an aluminum alloy, or a metallic compound is formed to coat the contact holes CNT4 and to cover the third interlayer insulation film 14. By patterning the conductive film that has been formed, wiring 8a and third relay electrodes 8b are formed. The third relay electrodes 8b are electrically connected to the respective second relay electrodes 31d via the contact holes CNT4.

The wiring 8a is formed to planarly overlap the semiconductor layer 30a, the data line 6, and the storage capacitance 31. A fixed potential is given to the wiring 8a, and thus the wiring 8a function as a shielding layer. The wiring 8a and the third relay electrodes 8b are also formed using light-shielding conductive films. Hence, in a case where the storage capacitance 31 is considered a third light-shielding layer, the wiring 8a and the third relay electrodes 8b correspond to a fourth light-shielding layer.

A fourth interlayer insulation film 15 is formed to cover the wiring 8a and the third relay electrodes 8b. The fourth interlayer insulation film 15 may also be formed by using, for example, silicon oxide. Contact holes CNT5 are respectively formed through the fourth interlayer insulation film 15 to reach the third relay electrodes 8b.

Then, a transparent conductive film (electrode film) of ITO or the like is formed to coat the contact holes CNT5 and to cover the fourth interlayer insulation film 15. By patterning the transparent conductive film (electrode film) that has been formed, pixel electrodes 16 are formed to electrically connect to the respective third relay electrodes 8b via the contact holes CNT5.

Each of the third relay electrodes 8b is electrically connected to the second source-drain region of the TFT 30 via the contact hole CNT4, the second capacitance electrode 31b, the second relay electrode 31d, the contact hole CNT3, and the first relay electrode 6b. Each of the third relay electrodes 8b is electrically connected to the pixel electrode 16 via the contact hole CNT5.

Each of the first capacitance electrodes 31a is formed across a plurality of pixels P, and functions as the capacitance line 7 in the equivalent circuit (see FIG. 3). A fixed potential is given to the first capacitance electrodes 31a. Hence, the potential given to the pixel electrode 16 via the second source-drain region of the TFT 30 is kept between the first capacitance electrode 31a and the second capacitance electrode 31b.

An alignment film 18 is formed to cover the pixel electrodes 16, and an alignment film 24 is formed to cover the counter electrode 23 of the counter substrate 20, which is disposed opposite the element substrate 10, with the liquid crystal layer 50 interposed between the element substrate 10 and the counter substrate 20. As described earlier, the alignment films 18 and 24 are each an inorganic alignment film and are each an aggregate of columnar bodies 18a and 24a formed by obliquely vapor-depositing an inorganic material such as silicon oxide from a predetermined direction and then making the vapor-deposited material grow in columnar shape.

Liquid crystal molecules LC having a negative dielectric anisotropy to such alignment films 18 and 24 are oriented in a substantially vertical alignment (VA) with respect to the normal direction of the alignment film surface with a pretilt angle θp of 3 to 5 degrees at oblique angles of the columnar bodies 18a and 24a. By applying an alternating voltage (drive signal) between the pixel electrode 16 and the counter electrode 23, the liquid crystal layer 50 is driven. Then, the liquid crystal molecules LC behave (oscillate) to tilt in a direction of the electric field generated between the pixel electrode 16 and the counter electrode 23.

Figure 5:
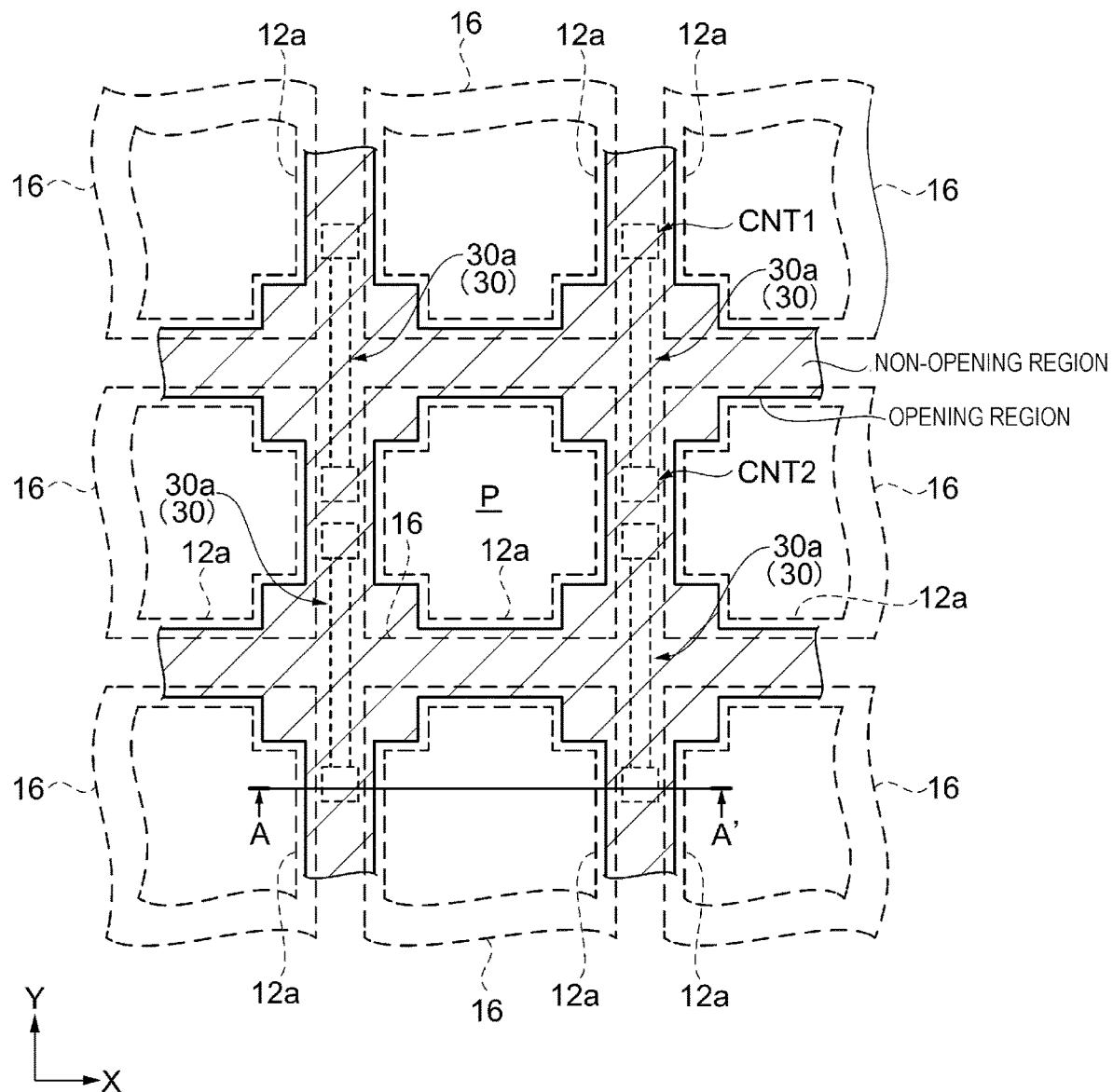
FIG. 5 is a schematic plan view illustrating principal components of a pixel and the relationship of the components with an opening region and a non-opening region.

Next, a planar disposition of principal components in the pixels P will be described by referring to FIG. 5. FIG. 5 is a schematic plan view illustrating principal components of a pixel and relationship between an opening region and a non-opening region.

As illustrated in FIG. 5, each of the pixels P included in the liquid crystal device 100 includes an opening region with, for example, a substantially quadrilateral shape (substantially square shape) in a planar view. Each of the opening regions is surrounded by the non-opening regions with a light-shielding characteristic that extend both in X direction and in Y direction and that are formed to have a grid shape.

The non-opening region extending in X direction includes the scanning line 3 illustrated in FIG. 3 and FIG. 4. The scanning line 3 includes a light-shielding conductive member, and the scanning line 3 constitutes a part of the non-opening region.

Likewise, the non-opening region extending in the Y direction includes the data line 6 and the capacitance line (first capacitance electrode 31a) illustrated in FIG. 3 and FIG. 4. The data line 6 and the capacitance line 7 (first capacitance electrode 31a) also include light-shielding conductive films, and the data line 6 and the capacitance line 7 constitute a part of the non-opening region.

The TFTs 30 illustrated in FIG. 3 and FIG. 4 are provided at the intersections of the non-opening regions. The semiconductor layer 30a of each TFT 30 in the first exemplary embodiment is disposed at an intersection of the non-opening regions, and extends in Y direction. The contact holes CNT1 used for connecting the semiconductor layers 30a and the data lines 6, and the contact holes CNT2 used for connecting the semiconductor layers 30a and the first relay electrodes 6b are also disposed in the non-opening regions. By providing the TFTs 30 at the intersections of the non-opening regions with a light-shielding characteristic, a certain opening ratio is ensured for the opening regions.

A detailed structure of the element substrate 10 will be described later. Since the TFTs 30 are provided at the intersections, the width of the non-opening region at each intersection is wider than the widths of other portions of the non-opening regions. The direction in which the semiconductor layers 30a extend at the intersections of the non-opening regions is not limited to Y direction, but the semiconductor layers 30a may extend in X direction. Accordingly, the shape of the intersections of the non-opening regions may be any shape that corresponds to the dispositions of TFTs 30. The intersections of the non-opening regions may not necessarily extend equally in X direction and Y direction toward the opening regions.

The pixel electrodes 16 are provided individually to the pixels P. Each of the pixel electrodes 16 has a substantially square shape in a planar view, and is provided in the opening region for the outer edge of the pixel electrode 16 to overlap the non-opening region. Although not illustrated in FIG. 5, the storage capacitances 31, the wiring 8a, and the like illustrated in FIG. 4 are also provided in the non-opening regions.

The liquid crystal device 100 of the first exemplary embodiment is of a transmissive type, and adopts a configuration, in which assuming that the light enters from the counter substrate 20 side, the element substrate 10 blocks the light that may enter the TFTs 30, and the light having entered the opening regions is prevented from diffusing in the element substrate 10 to improve the use efficiency of light.

The parts indicated by broken lines within the opening regions in FIG. 5 represent side walls 12a of the second interlayer insulation film 12 described earlier. As will be described in detail later, the base substrate 10s of the liquid crystal device 100 of the first exemplary embodiment includes recessed portions 26 (see FIG. 6) formed individually in the opening regions of the pixels P. The side walls 12a indicated by broken lines in FIG. 5, in the second interlayer insulation film 12, cover side portions 26b of the recessed portions 26 (see FIG. 6) and serve as the interface with a second insulation layer 13 in a planar view (see FIG. 6). Detailed structure of the element substrate 10 will be described below.

Figure 6:
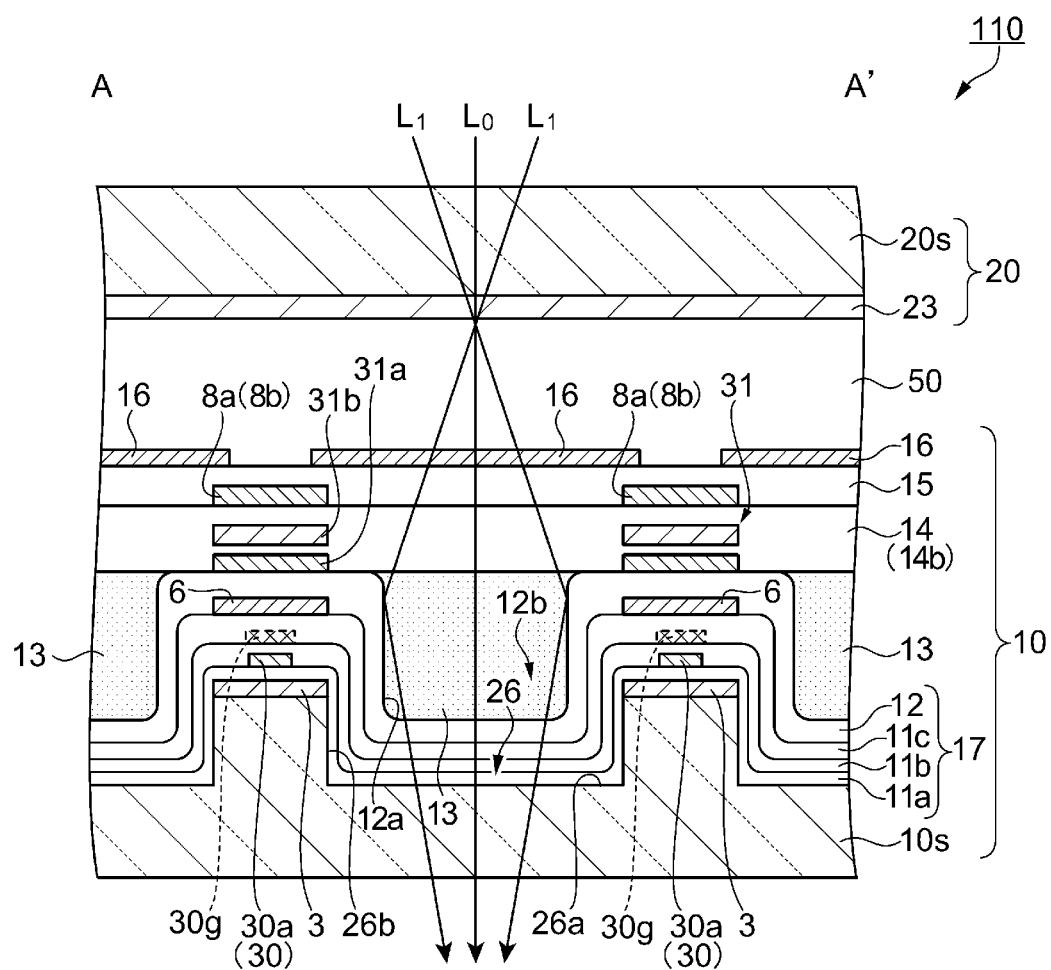
FIG. 6 is a schematic cross-sectional diagram illustrating a structure of the liquid crystal device taken along the line A-A' of FIG. 5.
Figure 7:
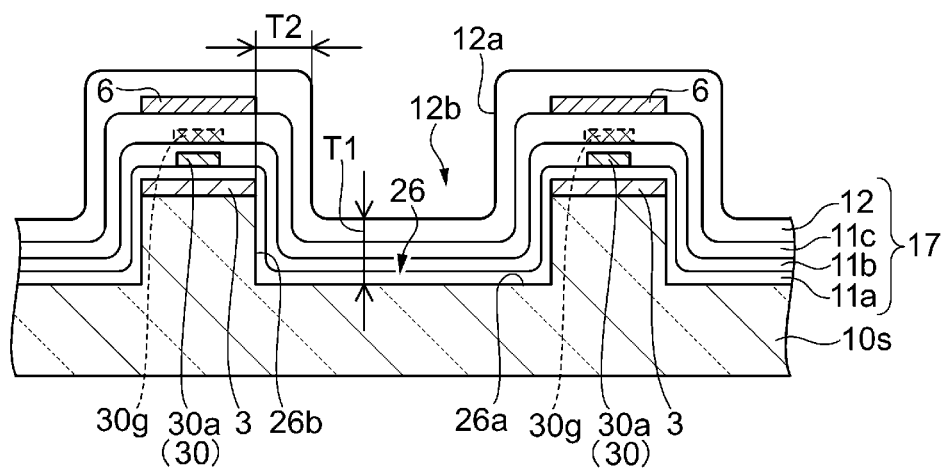
FIG. 7 is a partial cross-sectional diagram illustrating a structure of a first insulation layer of an element substrate.

FIG. 6 is a schematic cross-sectional diagram illustrating a structure of the liquid crystal device taken along the line A-A' of FIG. 5. The line A-A' of FIG. 5 is a line segment crossing the second source-drain regions (each corresponding to the drain of the TFT 30) of two adjacent semiconductor layers 30a that sandwich a common opening region are adjacent each other. The alignment films 18 and 24 in contact with the liquid crystal layer 50 and the planarization layer 22 of the counter substrate 20 are omitted in FIG. 6. FIG. 7 is a partial cross-sectional diagram illustrating a structure of a first insulation layer of an element substrate.

As illustrated in FIG. 6, the element substrate 10 having the pixel electrodes 16 and the counter substrate 20 having the counter electrode 23 are disposed opposite to each other with the liquid crystal layer 50 interposed between the element substrate 10 and the counter substrate 20. As described above, the pixel electrode 16 is disposed in an opening region with the outer edge of the pixel electrode 16 overlapping non-opening regions.

The base substrate 10s of the element substrate 10 includes the recessed portions 26 in the opening regions of the pixels P. In other words, the opening regions refer to regions where the recessed portions 26 are provided, whereas the non-opening regions refer to gaps between two adjacent recessed portions 26. Each of the recessed portions 26 includes a bottom portion 26a extending in the planar direction of the base substrate 10s, and side portions 26b each extending in the thickness direction of the base substrate 10s. The depth of the recessed portion 26 is, for example, approximately 0.5 μm to approximately 2 μm. The recessed portion 26 has a substantially quadrilateral shape (substantially square shape) in a planar view.

On top of the base substrate 10s, the scanning lines 3 serving as the first light-shielding layer, the underlying insulation film 11a, the semiconductor layers 30a of the TFTs 30, the gate insulation film 11b, the first interlayer insulation film 11c, the data lines 6 serving as the second light-shielding layer, the second interlayer insulation film 12, the storage capacitances 31, the third interlayer insulation film 14, the wiring 8a functioning as a shielding layer, the fourth interlayer insulation film 15, and the pixel electrodes 16 are layered in this order from the base substrate 10s side. Note that the gate electrodes 30g (indicated by broken lines in FIG. 6) are each disposed opposite the channel region of the semiconductor layer 30a with the gate insulation film 11b interposed between the semiconductor layer 30a and the gate electrodes 30g, though the gate electrodes 30g are not on the line A-A' of FIG. 5. Each of the TFTs 30 includes the gate electrode 30g.

The scanning lines 3, the data lines 6, the storage capacitances 31, and the wiring 8a, serving as light-shielding layers, are disposed in the non-opening regions. On the base substrate 10s, the scanning line 3 and the data line 6 are disposed sequentially in this order from the base substrate 10s side in the thickness direction of the base substrate 10s with a certain distance apart between the scanning line 3 and the data line 6, The TFT 30 is disposed between the scanning line 3 and the data line 6. The third interlayer insulation film 14 for covering the storage capacitances 31 and the fourth interlayer insulation film 15 for covering the wiring 8a are formed across the non-opening regions and the opening regions.

In addition, the underlying insulation film 11a, the gate insulation film 11b, the first interlayer insulation film 11c, and the second interlayer insulation film 12 are sequentially layered in this order from the base substrate 10s side, and are formed across the non-opening regions and the opening regions. The underlying insulation film 11a, the gate insulation film 11b, the first interlayer insulation film 11c, and the second interlayer insulation film 12 are examples of the first insulation layers in the disclosure. In the first exemplary embodiment, the above-described insulation films (first insulation layers) are all formed by using silicon oxide ($SiO_x$). The refractive indexes n1 of such films are from approximately 1.45 to approximately 1.46, depending upon the formation method, such as the vapor deposition method, the sputtering method, the CVD method, and the like.

Hereinafter, the layered films including the underlying insulation film 11a, the gate insulation film 11b, the first interlayer insulation film 11c, and the second interlayer insulation film 12 will be collectively referred to as a first insulation layer 17. A surface of second interlayer insulation film 12 covering the data lines 6 serving as the second light-shielding layer serves as the surface of the first insulation layer 17. In each opening region, the first insulation layer 17 is formed along the recessed portion 26. Hence, in each opening region, a recessed portion 12b, which reflects the shape of the recessed portion 26, is formed on the surface of the first insulation layer 17 (second interlayer insulation film 12). The surfaces of first insulation layer 17 (second interlayer insulation film 12) in the side portions of each recessed portion 12b (side portions 26b of each recessed portion 26) are referred to as side walls 12a. The angle made by the side walls 12a and the planar direction of the base substrate 10s is approximately 90±10 degrees.

The second insulation layer 13 is provided to fill in the recessed portions 12b. In other words, the second insulation layer 13 is provided in the opening region to be in contact with the first insulation layer 17. The side walls 12a of the first insulation layer 17 serve as the interface with the second insulation layer 13 in the side portions of the recessed portions 12b (side portions 26b of the recessed portions 26). In the bottom portion of each recessed portion 12b (bottom portion 26a of each recessed portion 26), a part of the second insulation layer 13 to be in contact with the first insulation layer 17 is referred to as a bottom portion of the second insulation layer 13.

The second insulation layer 13 of the first exemplary embodiment is formed by using, for example, silicon oxide ($SiO_xN_y$). The refractive index n2 of the second insulation layer 13 to be in contact with the side walls 12a is, for example, from 1.65 to 1.85, depending upon the method for forming the second insulation layer 13.

The liquid crystal device 100 of the first exemplary embodiment is used as an optical modulation device of a projection-type display apparatus, which will be described later. In the first exemplary embodiment, the light emitted from the light source of the projection-type display apparatus enters from the counter substrate 20 side, passes through the opening regions where the pixel electrodes 16 of the element substrate 10 are disposed, and exits from the element substrate 10 side.

As illustrated in FIG. 6, the light $L_0$ enters in the normal direction of the pixel electrode 16 along the optical axis, passes through the fourth interlayer insulation film 15, the third interlayer insulation film 14, the second insulation layer 13, the first insulation layer 17, and the base substrate 10s in the opening region, and then exits. The light $L_1$ passes through the pixel electrode 16 obliquely with respect to the optical axis, enters the opening region of the element substrate 10, and reaches the side walls 12a of the first insulation layer 17. Then, the light $L_1$ is reflected on the side walls 12a and is then led to the opening region side.

This is because while satisfying the refractive index n1<the refractive index n2, the light $L_1$ enters the first insulation layer 17 with the refractive index of n1 from the second insulation layer 13 with the refractive index of n2, which is larger than the refractive index n1. In accordance with Snell's law, the light is reflected by the side walls 12a, which serve as the interface with the second insulation layer 13. In a case where an angle of incidence made by the light $L_1$ with the normal line of the side walls 12a is larger than a critical angle θc, the $L_1$ is totally reflected on the side walls 12a. According to Snell's law, when n1<n2 is satisfied, the critical angle θc is represented by θc=arcsin(n1/n2).

Even in a case where, for example, the light $L_1$ passes through the pixel electrode 16 obliquely with respect to the optical axis, enters the opening region of the element substrate 10, and then enters toward an end portion of the data line 6 serving as the second light-shielding layer disposed immediately over the TFT 30, the light $L_1$ is reflected on the side walls 12a. Therefore, as a result, light diffraction is unlikely to occur at the end portion of the data line 6. Accordingly, the light that has been diffracted at the end portion of the data line 6 is prevented from entering the semiconductor layer 30a of the TFT 30 and generating a photo leakage current.

In addition, although not illustrated in FIG. 6, even in a case where the light is emitted from the light source of a projection-type display apparatus and enters from the element substrate 10 side, the light is blocked by the scanning lines 3 disposed immediately below the TFTs 30. Hence, the light is prevented from entering the semiconductor layers 30a of the TFTs 30 and generating a photo leakage current.

As illustrated in FIG. 7, T1 refers to thickness of the first insulation layer 17 at the bottom portion of each of the recessed portions 12b (the bottom portion 26a of each of the recessed portions 26), and T2 refers to thickness of the first insulation layer 17 at the side portion of each of the recessed portions 12b (the side portion 26b of each of the recessed portions 26). In the first exemplary embodiment, the thickness T2 of the first insulation layer 17 at the side portion of each of the recessed portions 12b may be equal to or smaller than the thickness T1 of the first insulation layer 17 at the bottom portion of each of the recessed portions 12b.

In a case where the thickness T2 of the first insulation layer 17 is too large, the side walls 12a of the first insulation layer 17 become too remote from the non-opening regions, and, as a result, less light is reflected by the interface between the first insulation layer 17 and the second insulation layer 13. Hence, the efficiency of using the light having entered the opening regions is impaired and is more susceptible to the light diffraction at the end portions of the data lines 6.

For the purpose of reducing the light to be diffracted at the end portions of the data lines 6, the positions of the side walls 12a of the first insulation layer 17 covering the data lines 6 may be separated from the non-opening region by a distance of at least 0.1 μm. In addition, for the purpose of using Snell's law, thus allowing efficient reflection of the light entering the side walls 12a of the first insulation layer 17 and increasing the light to pass through the opening regions, the positions of the side walls 12a of the first insulation layer 17 may be remote from the non-opening region by a distance of at least 0.1 μm to 1.0 μm. The distance may be from 0.2 μm to 0.5 μm. Accordingly, the thickness T2 of the first insulation layer 17 at the side portions of each of the recessed portions 12b may be from 0.1 μm to 1.0 μm. The thickness may be from 0.2 μm to 0.5 μm.

On the other hand, the thickness T1 of the first insulation layer 17 at the bottom portion of each of the recessed portions 12b does not greatly affect the efficiency of using light. The thickness T1 of the first insulation layer 17, however, may be set to be smaller than the depth of each of the recessed portions 26 so that the surface of the first insulation layer 17 at the bottom portion of each of the recessed portions 12b is on the base substrate 10s side of (i.e., below the level of) the scanning lines 3. Accordingly, at the bottom portion of each of the recessed portions 12b, the bottom portion of the second insulation layer 13 that is in contact with the first insulation layer 17 may be below the scanning lines 3.

In a case where the bottom portion of the second insulation layer 13 is below the scanning lines 3, the ends of the side walls 12a of the first insulation layer 17, which are the interfaces with the second insulation layer 13, extend below the scanning lines 3. Hence, even when light enters, from the element substrate 10 (base substrate 10s) side, the end portions of the scanning lines 3 serving as the first light-shielding layer disposed immediately below the TFTs 30, such light is to be reflected on the side walls 12a. Accordingly, as light diffraction is unlikely to occur at the end portions of the scanning lines 3, the light that has been diffracted at the end portions of the scanning lines 3 is prevented from entering the semiconductor layers 30a of the TFTs 30 and generating a photo leakage current.

Figure 8:
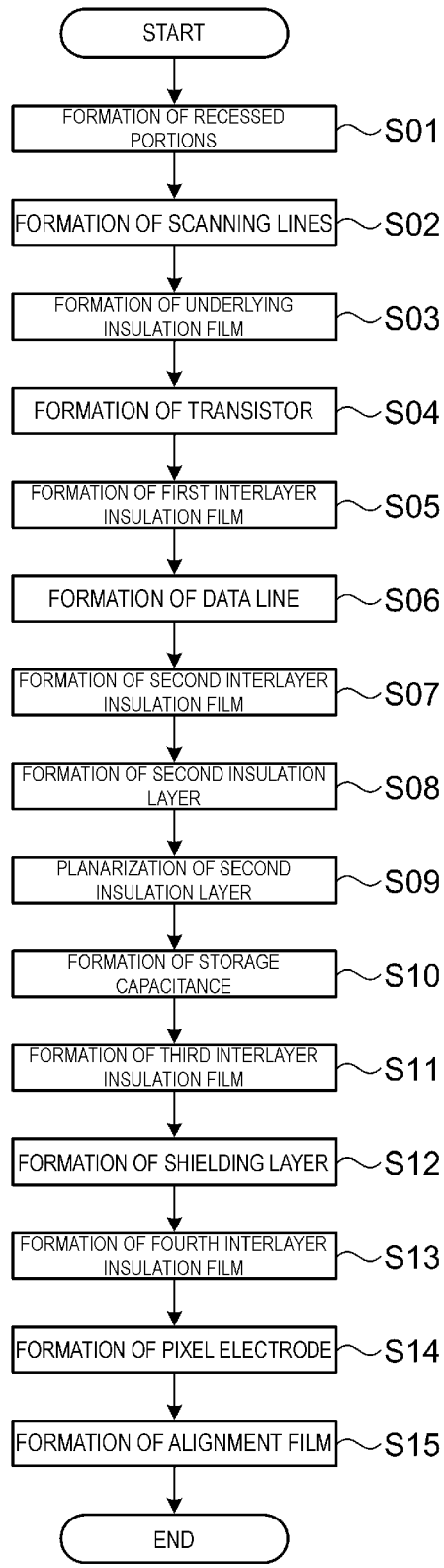
FIG. 8 is a flowchart illustrating a method for producing an element substrate of the first exemplary embodiment.

According to a method for producing an element substrate, which will be described later, the first insulation layer 17 is formed easily to have a thickness T2 at the side portion of each recessed portion 12b (side portion 26b of each recessed portion 26) that is not larger than the thickness T1 at the bottom portion of each recessed portion 12b (bottom portion 26a of each recessed portion 26). Method for producing liquid crystal device As described earlier, the liquid crystal device of some embodiments is associated with the structure of the element substrate 10. Accordingly, a method for producing the element substrate 10 will be described as a method for producing a liquid crystal device of the first exemplary embodiment by referring to FIG. 8 to FIG. 18. FIG. 8 is a flowchart illustrating a method for producing an element substrate of the first exemplary embodiment. FIG. 9 to FIG. 18 are schematic cross-sectional diagrams illustrating a method for producing an element substrate of the first exemplary embodiment. Specifically, FIG. 9 to FIG. 18 are diagrams corresponding to the schematic cross-sectional diagram of FIG. 6 illustrating a structure of the element substrate.

As illustrated in FIG. 8, a method for producing an element substrate 10 of the first exemplary embodiment includes a recessed-portion formation process (Step S01), a scanning-line formation process (Step S02), an underlying insulation film formation process (Step S03), a transistor formation process (Step S04), a first interlayer insulation film formation process (Step S05), data-line formation process (Step S06), a second interlayer insulation film formation process (Step S07), and a second insulation layer formation process (Step S08).

In addition, the method also includes a second insulation layer planarization process (Step S09), a storage capacitance formation process (Step S10), a third interlayer insulation film formation process (Step S11), a shielding layer formation process (Step S12), a fourth interlayer insulation film formation process (Step S13), a pixel electrode formation process (Step S14), and an alignment layer formation process (Step S15).

Figure 9:
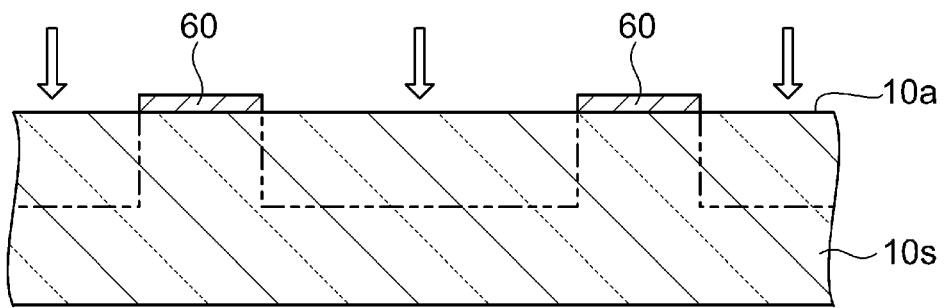
FIG. 9 is a schematic cross-sectional diagram illustrating a method for producing the element substrate of the first exemplary embodiment.

In the recessed portion formation process of Step S01, as illustrated in FIG. 9, a metal mask 60 is formed, by using a photolithography method, in an area on the base substrate 10s which area will be a non-opening region. A hard mask made from a metal material such as tungsten silicide (WSi) may be used as the metal mask 60. The material of the metal mask 60 may be tungsten (W), Chromium (Cr), and silicon (Si).

Figure 10:
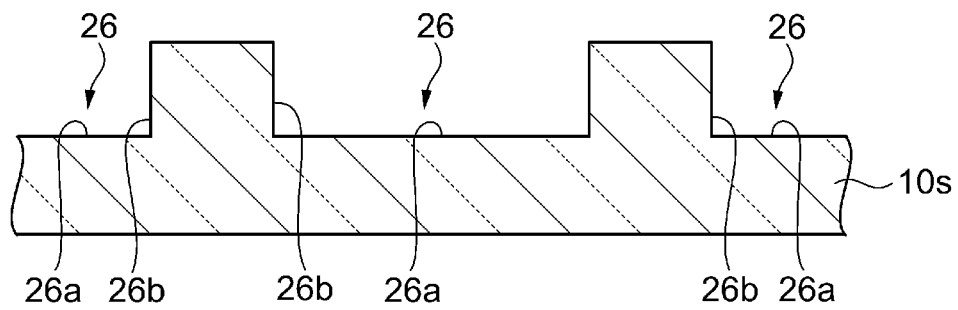
FIG. 10 is a schematic cross-sectional diagram illustrating a method for producing the element substrate of the first exemplary embodiment.

Then some thickness direction parts of the base substrate 10s corresponding to the opening regions are removed by an anisotropic etching method such as a dry etching method using the metal mask 60. Thus, as illustrated in FIG. 10, in the opening regions of the base substrate 10s, the recessed portions 26 each of which has a bottom portion 26a and side portions 26b are formed to individually correspond to the pixels P. FIG. 10 illustrates a state where recessed portions 26 have been formed and then the metal mask 60 has been removed.

In a case where, in the recessed portion formation process of Step S01, the angles made by the side portions 26b of the formed recessed portions 26 and the planar direction of the base substrate 10s fluctuate, the angles made by the side walls 12a of the first insulation layer 17 (which will be formed in later processes) (including the underlying insulation film 11a, the gate insulation film 11b, the first interlayer insulation film 11c, the second interlayer insulation film 12) and the planar direction of the base substrate 10s also fluctuates. As a result, the side walls 12a, which are the interface with the second insulation layer 13, may reflect little or no light $L_1$ having obliquely entered. In addition, in a case where the flatness of the side portions 26b of the formed recessed portions 26 is impaired, the flatness of the side walls 12a of the first insulation layer 17 to be formed in later processes may also be impaired, which may cause oblique incident light $L_1$ to be reflected on the side walls 12a in an irregular manner. Such irregular reflection may result in reduced brightness and/or contrast as well as may produce stray light.

The use of the metal mask 60 in the anisotropic etching in the first exemplary embodiment provides easier control of the angle made by the side walls 12a and the planar direction of the base substrate 10s than in a case of using a resist mask. In addition, compared to a case of using a resist mask, the use of the metal mask 60 reduces the fluctuation of the angle made by the side walls 12a and the planar direction of the base substrate 10s, and thus improves the flatness of the side walls 12a.

Figure 11:
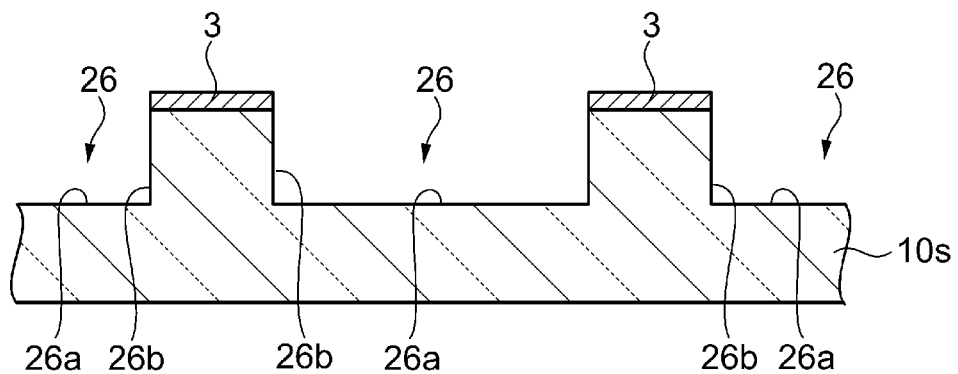
FIG. 11 is a schematic cross-sectional diagram illustrating a method for producing the element substrate of the first exemplary embodiment.
Figure 12:
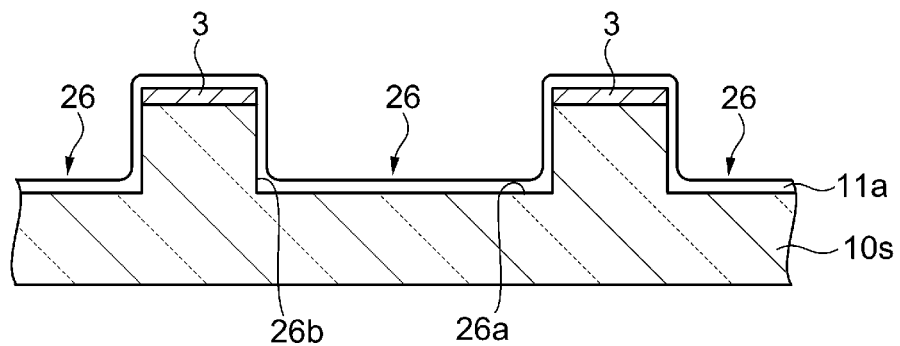
FIG. 12 is a schematic cross-sectional diagram illustrating a method for producing the element substrate of the first exemplary embodiment.

The following processes Step S02 to Step S06 are carried out by employing publicly known methods, and thus no detailed description of the processes will be provided. In the scanning line formation process of Step S02, as illustrated in FIG. 11, the scanning lines 3 serving as the first light-shielding layer are formed in the non-opening regions on top of the base substrate 10s. Then in the underlying insulation film formation process of Step S03, as illustrated in FIG. 12, the underlying insulation film 11a is formed to cover the scanning lines 3 across the opening regions and the non-opening regions.

Figure 13:
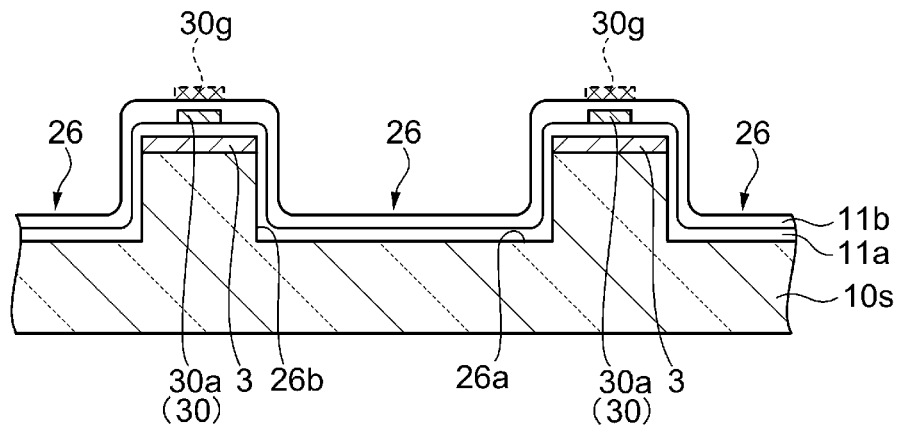
FIG. 13 is a schematic cross-sectional diagram illustrating a method for producing the element substrate of the first exemplary embodiment.

In the subsequent transistor formation process of Step S04, as illustrated in FIG. 13, the semiconductor layers 30a of the TFTs 30 are formed in the non-opening regions on top of the underlying insulation film 11a, and then the gate insulation film 11b is formed to cover the semiconductor layers 30a across the opening regions and the non-opening regions. The gate insulation film 11b may affect the electrical characteristics of the TFTs 30, and therefore a proper control is carried out to give the gate insulation film 11b a thickness from 50 nm to 100 nm, approximately. Then, the gate electrodes 30g are formed in the non-opening regions on top of the gate insulation film 11b.

Figure 14:
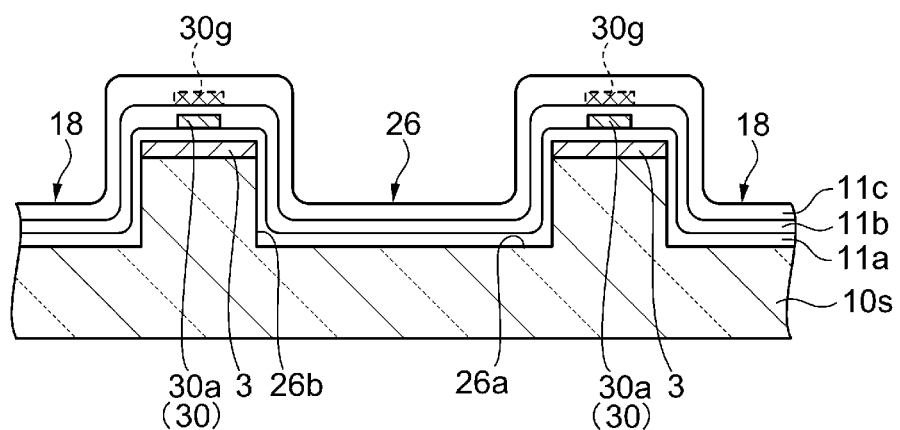
FIG. 14 is a schematic cross-sectional diagram illustrating a method for producing the element substrate of the first exemplary embodiment.

In the subsequent first interlayer insulation film formation process of Step S05, as illustrated in FIG. 14, the first interlayer insulation film 11c is formed to cover the gate electrode 30g across the opening regions and the non-opening regions. As the first interlayer insulation film 11c covers the TFTs 30, the surface of the first interlayer insulation film 11c is an irregular surface. Hence, once the first interlayer insulation film 11c is formed, a planarization treatment such as a CMP treatment may be carried out.

Figure 15:
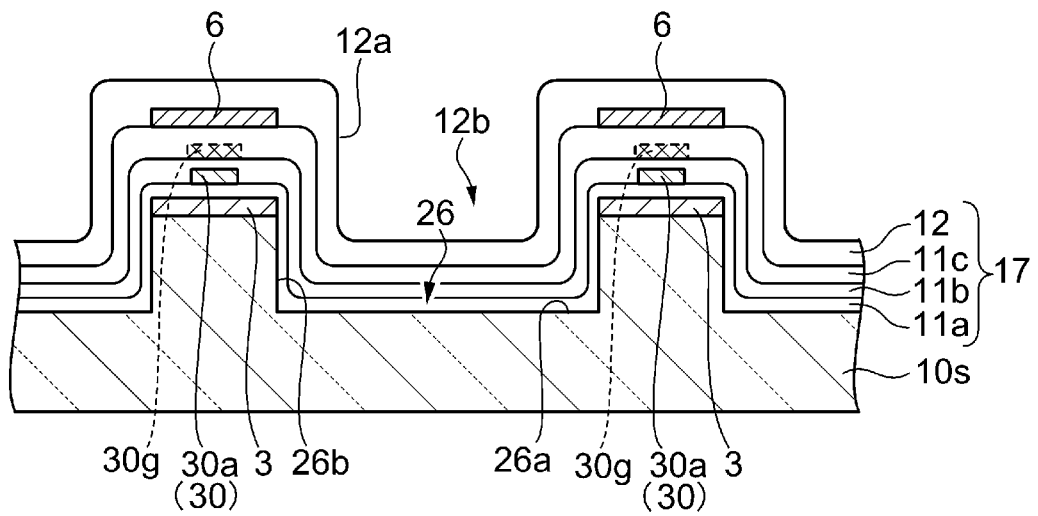
FIG. 15 is a schematic cross-sectional diagram illustrating a method for producing the element substrate of the first exemplary embodiment.

In the subsequent data line formation process of Step S06, as illustrated in FIG. 15, the data lines 6 serving as the second light shielding layer are formed in the non-opening regions on top of the first interlayer insulation film 11c. In Step S06, the first relay electrodes 6b are also formed in the same layer as the layer where the data lines 6 are formed. Then in the second interlayer insulation film formation process of Step S07, the second interlayer insulation film 12 is formed to cover the data lines 6 and the first relay electrodes 6b across the opening regions and the non-opening regions. As illustrated in FIG. 15, the first insulation layer 17 includes the underlying insulation film 11a, the gate insulation film 11b, the first interlayer insulation film 11c, and the second interlayer insulation film 12 all of which are formed across the opening regions and the non-opening regions.

Of the individual constituent insulation films of the first insulation layer 17, the thicknesses of all the insulation films but the gate insulation film 11b (whose thickness was described earlier) are determined appropriately for the film thicknesses of the objects to be coated by the individual insulation films. Compared to the thickness of the gate insulation film 11b, the underlying insulation film 11a, the first interlayer insulation film 11c, and the second interlayer insulation film 12 are controlled to have relatively large thicknesses ranging from several hundred nm to 1 µm, approximately. As an example, a method for forming such insulation films is a plasm CDV technique using tetraethoxysilane (TEOS) as a source gas. According to the plasm CDV technique, the base substrate 10s that is heated at, for example, 300° C. to 350° C. is exposed to and is made to react with the source-gas plasma. As a result, a silicon oxide film ($SiO_2$ film) having a refractive index from 1.45 to 1.46 is formed as an insulation film.

Each of the insulation films included in the first insulation layer 17 is formed across the opening regions and the non-opening regions, and conforms to the shapes of the recessed portions 26 in the opening regions. Hence, in each of the opening regions, a recessed portion 12b reflecting the shape of the recessed portion 26 is formed in the surface of the first insulation layer 17 (second interlayer insulation film 12). Some sections of the surface of the first insulation layer 17 (second interlayer insulation film 12) that cover the side portions 26b of the recessed portions 26 in the recessed portions 12b become the side walls 12a.

As described earlier, the thickness T2 of the first insulation layer 17 at the side portions of the recessed portion 12b (at the side portions 26b of each of the recessed portions 26) may be not larger than the thickness T1 of the first insulation layer 17 at the bottom portion of each of the recessed portions 12b (at the bottom portion 26a of each of the recessed portions 26) (see FIG. 7). In a case where, as is the case with the first exemplary embodiment, each of the insulation films included in the first insulation layer 17 is formed by the above-described method, the thickness T2 of the first insulation layer 17 at the side portions of the recessed portion 12b (at the side portions 26b of each of the recessed portions 26) is easily made not larger than the thickness T1 of the first insulation layer 17 at the bottom portion of each of the recessed portions 12b (at the bottom portion 26a of each of the recessed portions 26).

In addition, as described earlier, the surface of the first insulation layer 17 at the bottom portion of each of the recessed portions 12b may be on the base substrate 10s side of (i.e., below the level of) the scanning lines 3. In the first exemplary embodiment, by setting appropriately the depth of each of the recessed portions 26 formed in Step S01 and the thicknesses of the individual insulation films formed in Step S03 to Step S07, the thickness T1 of the first insulation layer 17 is easily made smaller than the depth of each of the recessed portions 26. Thus, the bottom portion of the second insulation layer 13 that is in contact with the first insulation layer 17 at the bottom portion of each of the recessed portions 12b is positioned below the level of scanning lines 3.

In another conceivable method that is not like the method employed in the first exemplary embodiment, such structures as the scanning lines 3, the TFTs 30, data lines 6, etc. and the first insulation layer 17 covering such structures are formed on top of/over the base substrate 10s, and then the recessed portions 26 are formed in the first insulation layer 17 to provide the side walls 12a. However, in a case where the formation of such structures as the scanning lines 3, the TFTs 30, the data lines 6 is followed by the formation of the first insulation layer 17 and then by the formation of the recessed portions 26 in the first insulation layer 17, the conditions for the etching or the like treatment to form the recessed portions 26 are restricted.

For example, in a case where an anisotropic etching treatment using the metal mask 60 is carried out after such structures as the scanning lines 3, TFTs 30, the data lines 6, etc. are formed, the removing of the metal mask 60 after the etching treatment may damage the structures. In a case of using a resist mask in place of the metal mask 60, the controlling of the angle made by the side walls 12a of the first insulation layer 17 and the planar direction of the base substrate 10s is more difficult and the angle itself is more likely to fluctuate, resulting in the impaired flatness of the side walls 12a. In addition, in a case where the formation of such structures as the scanning lines 3, the TFTs 30, the data lines 6, etc. is followed by the formation of the recessed portions 26, the positional relationship between each structure and the recessed portion 26 is more likely to fluctuate. As a result, the interface may reflect little or no light having obliquely entered.

In the first exemplary embodiment, the formation of the recessed portions 26 in the base substrate 10s precedes the formation of such structures as the scanning lines 3, the TFTs 30, the data line 6, etc. Hence, fewer restrictions are applied to the conditions for the etching or the like treatment, and thus the recessed portions 26 are formed using the metal mask 60 under more favorable conditions. In addition, as such structures as the scanning lines 3, the TFTs 30, the data line 6, etc. are formed over the base substrate 10s that has the recessed portions 26 having already been formed, the fluctuation of the positional relationships between the structures and the recessed portions 26 is reduced.

In addition, in the case of forming the recessed portions 26 after the formation of the structures and the first insulation layer 17, the film thicknesses T1 and T2 are determined by the etching amount of the first insulation layer 17. Hence the film thicknesses T1 and T2 are more likely to deviate from the intended thicknesses T1 and T2. In the first exemplary embodiment, the film thicknesses T1 and T2 are determined by the film thicknesses of the individual insulation films included in the first insulation layer 17 at the time of forming such insulation films. Hence, the intended film thicknesses T1 and T2 are accomplished more easily.

Figure 16:
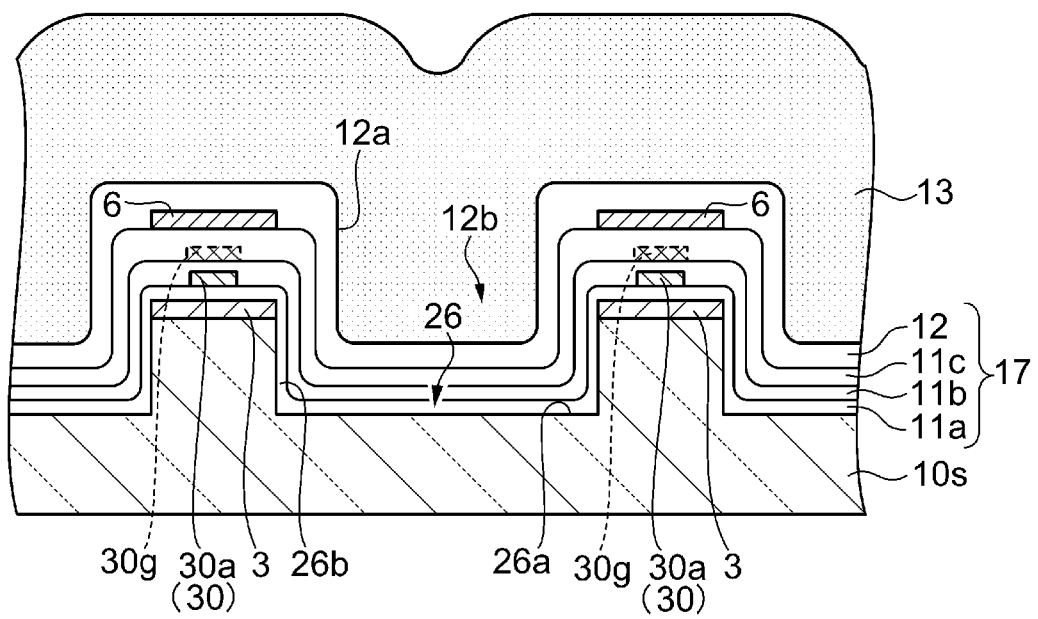
FIG. 16 is a schematic cross-sectional diagram illustrating a method for producing the element substrate of the first exemplary embodiment.

In the subsequent second insulation layer formation process of Step S08, as illustrated in FIG. 16, the second insulation layer 13 is formed to fill the recessed portions 12b across the opening regions and the non-opening regions. As an example, a method for forming the second insulation layer 13 is a plasm CDV technique using monosilane ($SiH_4$) gas, ammonia ($NH_3$) gas, and oxygen ($O_2$) gas as source gases. By this method, silicon oxynitrides having refractive indexes ranging from 1.65 to 1.85 ($SiO_xN_y$) are formed as the second insulation layer 13.

Figure 17:
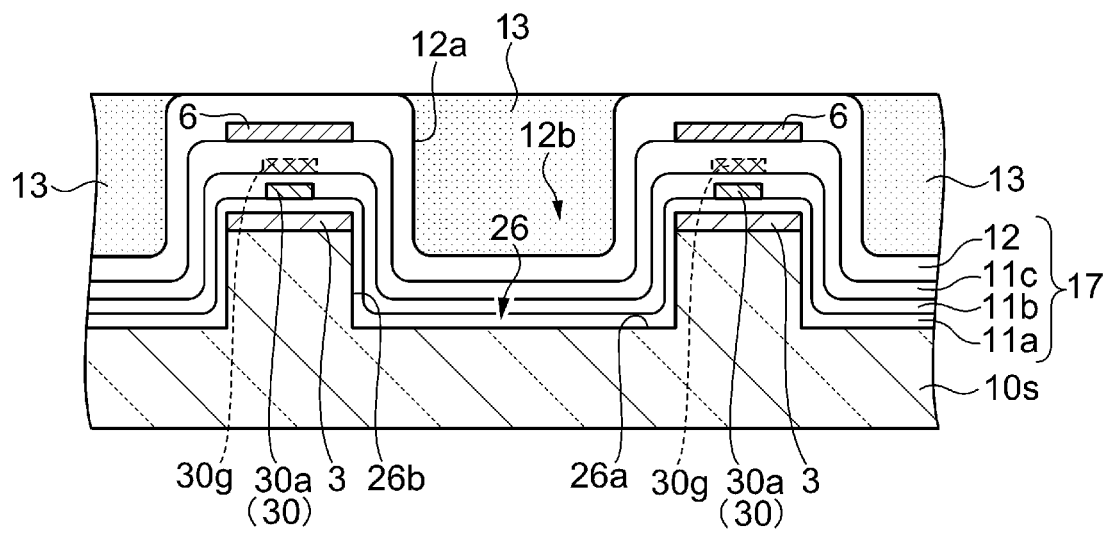
FIG. 17 is a schematic cross-sectional diagram illustrating a method for producing the element substrate of the first exemplary embodiment.

In the subsequent second insulation layer planarization process of Step S09, the formed second insulation layer 13 is planarized. Specifically, as illustrated in FIG. 17, the second insulation layer 13 is planarized through the combined treatment of a CMP treatment and an etching treatment until the first insulation layer 17 is exposed in the non-opening regions. By this method, the first insulation layer 17 is exposed in the non-opening regions and the second insulation layer 13 is formed to fill the recessed portions 12b in the opening regions.

Figure 18:
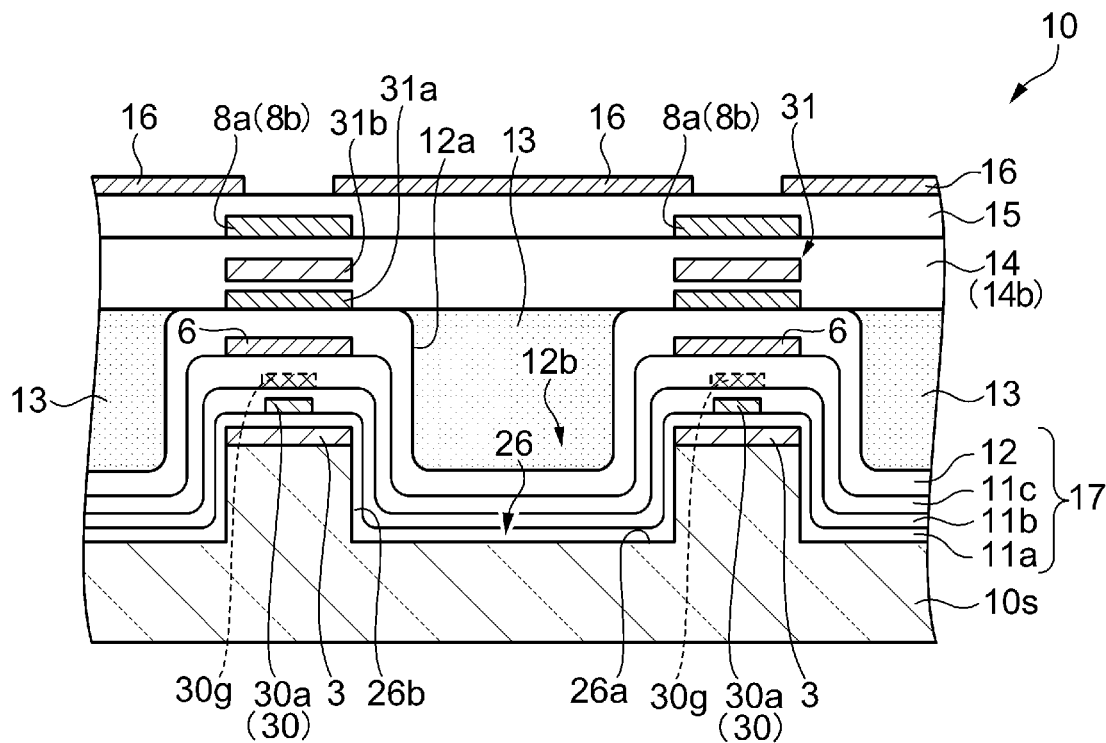
FIG. 18 is a schematic cross-sectional diagram illustrating a method for producing the element substrate of the first exemplary embodiment.

In the following Step S10 to Step S15, publicly known methods are employed individually. Specifically, as illustrated in FIG. 18, the storage capacitances 31 are formed in the non-opening regions in Step S10, the third interlayer insulation film 14 is formed to cover the storage capacitances 31 in Step S11, and the wiring 8a serving as a shielding layer are formed in the non-opening regions on the third interlayer insulation film 14 in Step S12.

The fourth interlayer insulation film 15 is formed to cover the wiring 8a in Step S13, and the pixel electrodes 16 are formed individually for the pixels on the fourth interlayer insulation film 15 in Step S14. In addition, the alignment film 18 is formed to cover the pixel electrodes 16 in Step S15. Though FIG. 18 does not illustrate the alignment film 18, the alignment film 18 that is an aggregation of columnar bodies 18a is formed in the first exemplary embodiment by an oblique vapor deposition of silicon oxide (see FIG. 4). By the processes described thus far, the formation of the element substrate 10 is completed.

According to the configuration of and the method for producing the element substrate 10 of the liquid crystal panel 110 of the first exemplary embodiment, the following effects are obtained.

The first insulation layer 17 is formed along the recessed portions 26 formed in the opening regions, and the second insulation layer 13 having a higher refractive index than the refractive index of the first insulation layer 17 is formed to cover the first insulation layer 17. Hence, the light having entered obliquely the side walls 12a of the first insulation layer 17, which are the interface with the second insulation layer 13 along the side portions 26b of the recessed portion 26 is reflected on the side walls 12a and is thus led to the inside of each of the opening regions. Accordingly, the light having entered the opening regions is used effectively. In addition, as the first insulation layer 17 covers the data lines 6 serving as the second light-shielding layer formed in the non-opening regions, the light traveling towards the end portions of the data lines 6 is also reflected on the side walls 12a of the first insulation layer 17. Hence, as the light diffraction is less likely to happen at the end portions of the data lines 6, a possible photo leakage current that may be caused by the entry of the diffracted light into the TFTs 30 is also reduced. In addition, as the formation of the recessed portions 26 in the base substrate 10s precedes the formation of such structures as the scanning lines 3 serving as the first light-shielding layer, TFTs 30, data lines 6, etc., the recessed portions 26 are formed using the metal mask 60 under more favorable conditions than in a case of forming the recessed portions 26 in the base substrate 10s after the formation of those structures. Accordingly, each of the side portions 26b of the recessed portions 26 is prevented from having a fluctuating angle and/or having a surface with impaired flatness, and deviation of the positional relationship between each of the recessed portions 26 and the data line 6 is prevented from occurring. As a result, the liquid crystal device 100 having a bright and excellent display quality is provided or produced.

The side walls 12a along the side portion 26b of the recessed portion 26 are on the base substrate 10s side of the scanning lines 3, which are formed at a closer position to the base substrate 10s than the TFTs 30. Hence, the light having entered the end portions of the scanning lines 3 from the base substrate 10s side is reflected on the side walls 12a of the first insulation layer 17 to the opening region side. Accordingly, if the light enters from the base substrate 10s side, the light having entered the opening regions is used effectively, and a photo leakage current that may be caused by the light having been diffracted at the end portions of the scanning lines 3 and entered the TFTs 30 is prevented from occurring.

By forming the first insulation layer 17 with a film thickness at the side portions 26b of the recessed portions 26 that is not larger than the film thickness at the bottom portions 26a of the recessed portions 26, the light having entered the side walls 12a of the first insulation layer 17 is reflected efficiently. Hence the efficiency of using the light having entered the opening regions is improved, and a photo leakage current that may be caused by the light having diffracted at the end portions of the data lines 6 is reduced.

Second Exemplary Embodiment

Electro-Optic Device

Figure 19:
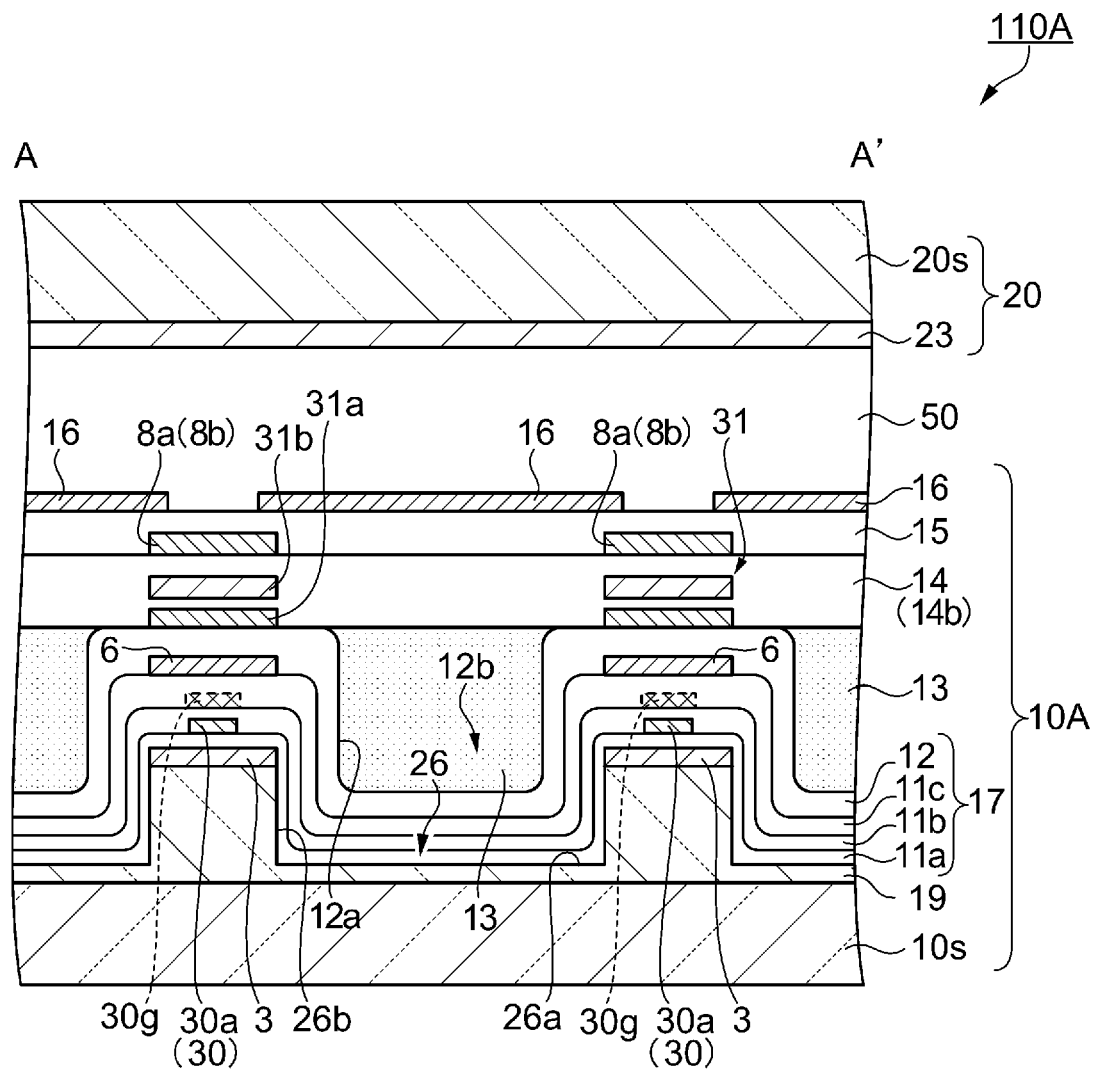
FIG. 19 is a schematic cross-sectional diagram illustrating a structure of a liquid crystal device of a second exemplary embodiment.

Next, a liquid crystal device as an electro-optic device of the second exemplary embodiment will be described by referring to FIG. 19. FIG. 19 is a schematic cross-sectional diagram illustrating a structure of a liquid crystal device of the second exemplary embodiment. Specifically, FIG. 19 corresponds to a schematic cross-sectional diagram illustrating a structure of the liquid crystal device taken along the line A-A' of FIG. 5. A liquid crystal panel 110A, which is an example of liquid crystal device of the second exemplary embodiment differs from the liquid crystal panel 110 of the first exemplary embodiment in the configuration of an element substrate 10A. Hereinafter, a configuration of and a method for producing the element substrate 10A of the second exemplary embodiment will be described by focusing on the differences from the case of the first exemplary embodiment. The identical constituents to the constituents in the first exemplary embodiment are represented by the identical reference numerals and are not described below.

As illustrated in FIG. 19, the element substrate 10A of the second exemplary embodiment differs from the element substrate 10 of the first exemplary embodiment in that an insulation layer 19 serving as a third insulation layer is disposed on top of the base substrate 10s, which is plane, and that the recessed portions 26 are formed in the insulation layer 19. The insulation layer 19 is formed of a silicon oxide film ($SiO_2$ film). In the insulation layer 19, the recessed portions 26 are formed in the opening regions of pixels P.

Though in FIG. 19, the depth of each of the recessed portions 26 is shallower (smaller) than the thickness of the insulation layer 19, the depth of each recessed portion 26 may be equal to the thickness of the insulation layer 19 or may be larger than the thickness of the insulation layer 19. Hence, the recessed portions 26 may pass through the insulation layer 19 to make the surface of the base substrate 10s serve as bottom portions 26a. Alternatively, the recessed portions 26 may pass through the insulation layer 19 to reach the base substrate 10s and thus form bottom portions 26a in the base substrate 10s.

On top of the insulation layer 19, the scanning lines 3 serving as the first light-shielding layer, the underlying insulation film 11a, the semiconductor layers 30a of the TFTs 30, the gate insulation film 11b, the first interlayer insulation film 11c, the data lines 6 serving as the second light-shielding layer, the second interlayer insulation film 12, the storage capacitances 31, the third interlayer insulation film 14, the wiring 8a, the fourth interlayer insulation film 15, and the pixel electrodes 16 are layered in this order from the insulation layer 19 side. Like the element substrate 10 of the first exemplary embodiment, the first insulation layer 17 includes the underlying insulation film 11a, the gate insulation film 11b, the first interlayer insulation film 11c, and the second interlayer insulation film 12, and the second insulation layer 13 is formed to fill the recessed portions 12b of the first insulation layer 17.

Method for Producing Liquid Crystal Device

Figure 20:
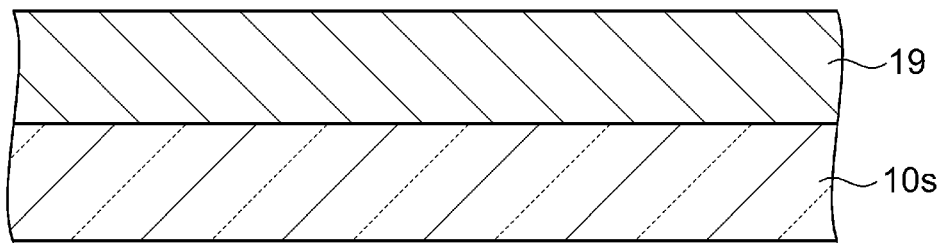
FIG. 20 is a schematic cross-sectional diagram illustrating a method for producing an element substrate of the second exemplary embodiment.
Figure 21:
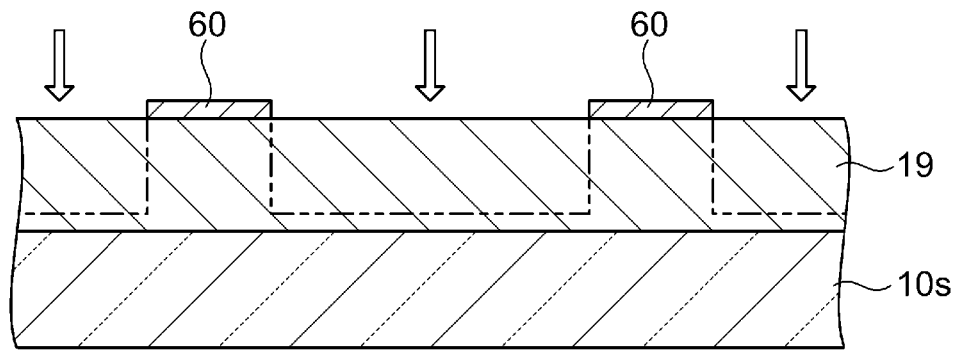
FIG. 21 is a schematic cross-sectional diagram illustrating a method for producing the element substrate of the second exemplary embodiment.
Figure 22:
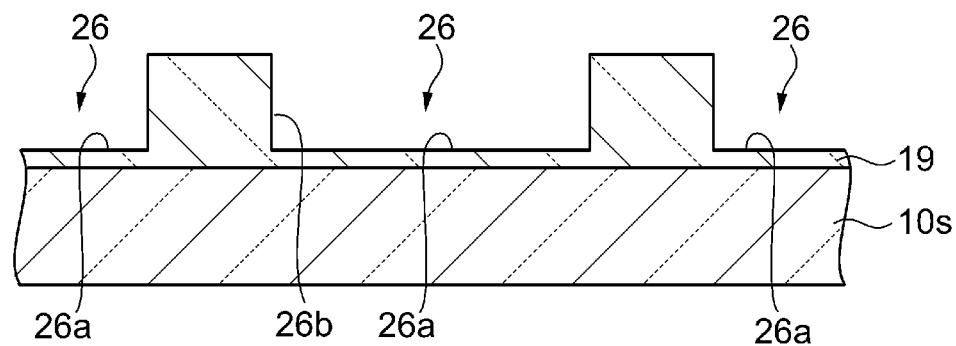
FIG. 22 is a schematic cross-sectional diagram illustrating a method for producing the element substrate of the second exemplary embodiment.

A method for producing the element substrate 10A will be described as a method for producing a liquid crystal device of the second exemplary embodiment by referring to FIG. 20 to FIG. 22. FIG. 20 to FIG. 22 are schematic cross-sectional diagrams illustrating a method for producing an element substrate of the second exemplary embodiment. The method for producing the element substrate 10A of the second exemplary embodiment differs from the method of the first exemplary embodiment in that in the recessed-portion formation process (Step S01) illustrated in FIG. 8, the insulation layer 19 serving as a third insulation layer is formed on the base substrate 10s, and the recessed portions 26 are formed in the insulation layer 19.

In Step S01, as illustrated in FIG. 20, the insulation layer 19 serving as the third insulation layer is formed on top of the base substrate 10s. Methods for forming the individual insulation films included in the first insulation layer 17 may be applied as a method for forming insulation layer 19. Then, as illustrated in FIG. 21, the metal mask 60 is formed on top of the insulation layer 19 in areas that are to be the non-opening regions, and an anisotropic etching treatment is carried out to remove a thickness direction part of the insulation layer 19 in the opening regions by using the metal mask 60. Thus, as illustrated in FIG. 22, in the opening regions of the insulation layer 19, the recessed portions 26 each of which has a bottom portion 26a and side portions 26b are formed to individually correspond to the pixels P.

The subsequent processes in Step S02 to Step S15 are similar to the processes in the first exemplary embodiment, and thus will not be described below.

According to the configuration of and the method for producing the element substrate 10A of the liquid crystal panel 110A of the second exemplary embodiment, similar effects to the effects obtained in the first exemplary embodiment are obtained. In an example of a configuration where an optical element such as a microlens is provided on top of the base substrate 10s, the insulation layer 19 serving as the third insulation layer may be, for example, a protective layer or an optical path length adjusting layer, each formed on the optical element.

Third Exemplary Embodiment

Electro-Optic Device

Figure 23:
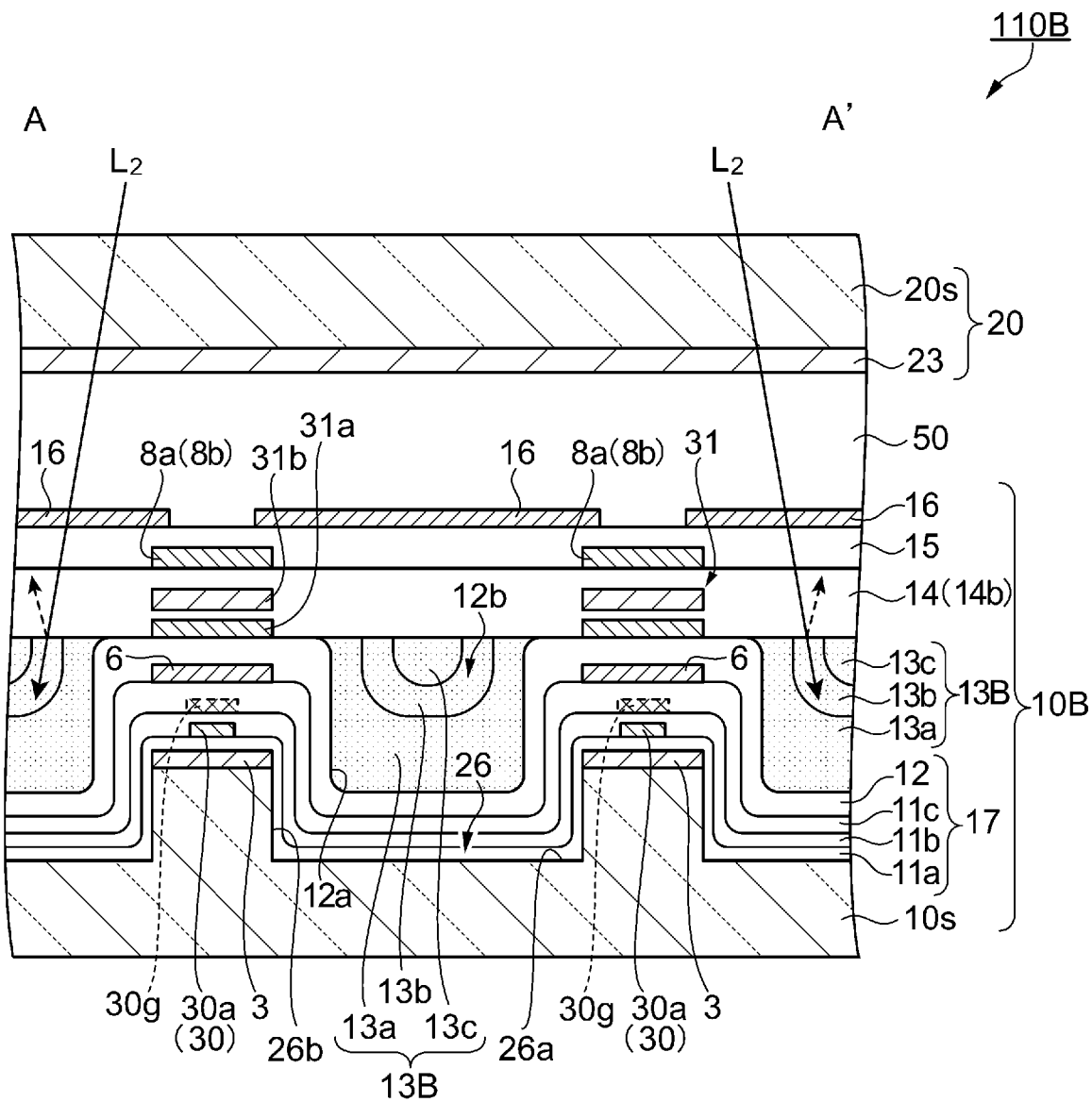
FIG. 23 is a schematic cross-sectional diagram illustrating a structure of a liquid crystal device of a third exemplary embodiment.

Next, a liquid crystal device as an electro-optic device of a third exemplary embodiment will be described by referring to FIG. 23. FIG. 23 is a schematic cross-sectional diagram illustrating a structure of a liquid crystal device of the third exemplary embodiment. Specifically, FIG. 23 corresponds to a schematic cross-sectional diagram illustrating a structure of the liquid crystal device taken along the line A-A' of FIG. 5. A liquid crystal panel 110B, which is an example of a liquid crystal device of the third exemplary embodiment differs from the liquid crystal panel 110 of the first exemplary embodiment in the configuration of an element substrate 10B. Hereinafter, a configuration of and a method for producing the element substrate 10B of the third exemplary embodiment will be described by focusing on the differences from the case of the first exemplary embodiment. The identical constituents to the constituents in the first exemplary embodiment are represented by the identical reference numerals and are not described below.

As illustrated in FIG. 23, the element substrate 10B of the third exemplary embodiment differs from the element substrate 10 of the first exemplary embodiment in that the second insulation layer 13B includes a first layer 13a that is in contact with the recessed portions 12b including the side walls 12a of the first insulation layer 17, as well as a second layer 13b and a third layer 13c that are layered consecutively on top of the first layer 13a.

The second insulation layer 13B of the third exemplary embodiment is formed by using, for example, silicon oxide ($SiO_xN_y$) as in Exemplar Embodiment 1. The refractive index n2 of the first layer 13a that is in contact with the side walls 12a is, for example, from 1.65 to 1.85 depending upon the method for forming the second insulation layer 13B. The refractive index n3 of the second layer 13b that is in contact with the first layer 13a is, for example, from 1.55 to 1.70. The refractive index n4 of the third layer 13c that is in contact with the second layer 13b is, for example, from 1.50 to 1.55.

The refractive index n4 of the third layer 13c is close to the refractive index n1 of the first insulation layer 17 that forms the side walls 12a. Hence the second insulation layer 13B has a portion whose refractive index decreases from n2 with the thickness direction distance from the base substrate 10s. In the third exemplary embodiment, the portion whose refractive index decreases from n2 is a portion including three layers with their respective refractive indexes changing in a stepwise manner the first layer 13a, the second layer 13b, and the third layer 13c are stacked one upon another. In the opening regions, the third interlayer insulation film 14 having a refractive index n1 is in contact with the first layer 13a (refractive index=n2), the second layer 13b (refractive index=n3), and the third layer 13c (refractive index=n4) of the second insulation layer 13B.

The number of stacked layers included in the second insulation layer 13B is not limited to 3, but the second insulation layer 13B may include at least 2 layers having different refractive indexes from each other. Alternatively, the second insulation layer 13B may be configured to have a continuously decreasing refractive index from n2 with the thickness direction distance from the base substrate 10s.

Also in the element substrate 10B of the third exemplary embodiment, the light $L_0$ having entered along the optical axis (see FIG. 6) exits by having passed through the fourth interlayer insulation film 15, the third interlayer insulation film 14, the second insulation layer 13B, and the base substrate 10s in the opening regions as is the case with the first exemplary embodiment. The light $L_1$ having entered obliquely with respect to the optical axis (see FIG. 6) is reflected on the side walls 12a of the first insulation layer 17 and is then led to the opening region side.

Accordingly, also in the element substrate 10B of the third exemplary embodiment, the light having entered the opening regions is used effectively, and a photo leakage current that may be caused by the light having been diffracted at the end portions of the data lines 6 and entered the TFTs 30 is prevented from occurring as is the case with the first exemplary embodiment. To reduce the light to be diffracted at the end portions of the data lines 6, at the portion that is in contact with the side walls 12a of the first insulation layer 17, the thickness of the first layer 13a having a refractive index of n2 may be at least 1 μm.

On the other hand, as illustrated in FIG. 23, for example, in a case of the light $L_2$ having passed through the third interlayer insulation film 14 and entered the first layer 13a and/or the second layer 13b of the second insulation layer 13B, some part of the light $L_2$ is reflected on the interface between the third interlayer insulation film 14 and the second insulation layer 13B as indicated by the broken lines due to the different refractive indexes, and the rest of the light $L_2$ passes through the second insulation layer 13B. In addition, for example, in a case of the light $L_2$ having passed through the third interlayer insulation film 14 and entered the third layer 13c of the second insulation layer 13B, the smaller difference in the refractive index between the third interlayer insulation film 14 and the third layer 13c helps reduce the reflection on the interface between the third interlayer insulation film 14 and the third layer 13c, and the light $L_2$ passes through the third layer 13c.

In other words, in the interface portion with the third interlayer insulation film 14, the second insulation layer 13B has a reduced refractive index from n2. Hence, compared to the case where the portion of the second insulation layer 13B which portion is in contact with the above-mentioned interface has a refractive index n2, the reflection on the interface is reduced. Accordingly, the light having entered the opening regions of the element substrate 10B is less likely to be diffused while passing through the opening regions and exits from the base substrate 10s efficiently. To reduce the reflection on the interface, the refractive index of third interlayer insulation film 14 and the refractive index of the third layer 13c of the second insulation layer 13B may be equal to each other.

Method for Producing Liquid Crystal Device

Figure 24:
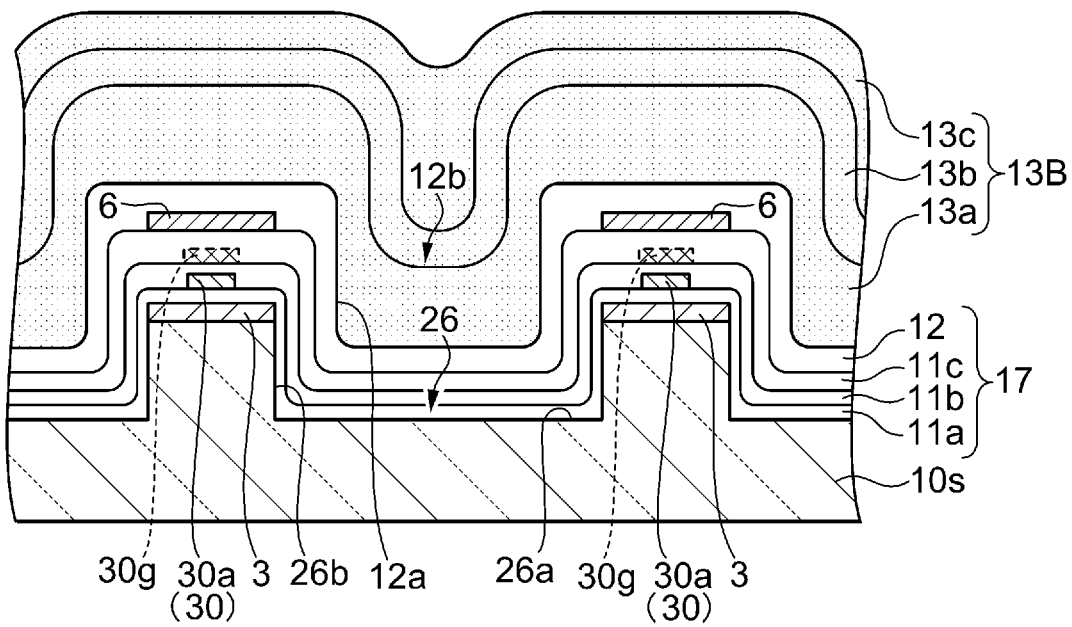
FIG. 24 is a schematic cross-sectional diagram illustrating a method for producing an element substrate of the third exemplary embodiment.
Figure 25:
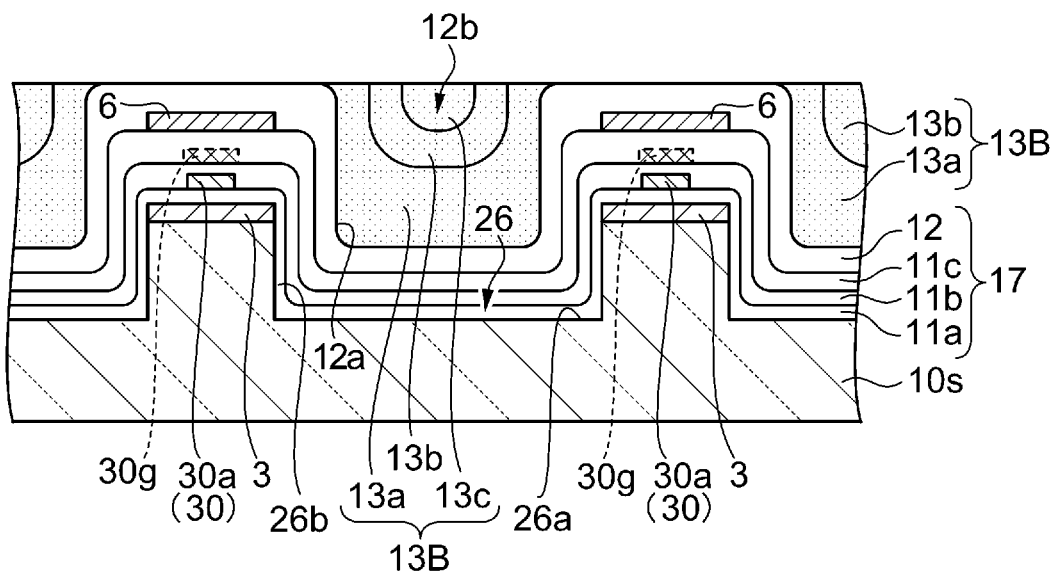
FIG. 25 is a schematic cross-sectional diagram illustrating a method for producing the element substrate of the third exemplary embodiment.

Accordingly, a method for producing the element substrate 10B will be described as a method for producing a liquid crystal device of the third exemplary embodiment by referring to FIG. 24 and FIG. 25. FIG. 24 and FIG. 25 are schematic cross-sectional diagrams illustrating a method for producing an element substrate of the third exemplary embodiment. The method for producing the element substrate 10B of the third exemplary embodiment differs from the method of the first exemplary embodiment in that in the second insulation layer formation process (Step S08) illustrated in FIG. 8, the second insulation layer 13B is formed by stacking layers with difference refractive indexes one upon another. The processes that are similar to the processes in the first exemplary embodiment will not be described below.

In Step S08, as illustrated in FIG. 24, the second insulation layer 13B is formed to fill the recessed portions 12b across the opening regions and the non-opening regions by forming consecutively and stack one upon another the first layer 13a, the second layer 13b, and the third layer 13c with different refractive indexes from one another. For example, a method for forming such a second insulation layer 13B is a plasm CDV technique using monosilane ($SiH_4$) gas, ammonia ($NH_3$) gas, and oxygen ($O_2$) gas as source gases.

The refractive index of the silicon oxynitride ($SiO_xN_y$) film obtained after the film formation is changed by changing flow rate of the ammonia ($NH_3$) gas within the flow rate of the entire source gases. In a case where the flow rate of ammonia ($NH_3$) gas is increased, the refractive index of the silicon oxynitride film thus obtained becomes closer to the refractive index (=approximately 1.9) of a silicon nitride film, and specifically, the refractive index of the silicon oxynitride film becomes approximately 1.85. In a case where the flow rate of ammonia ($NH_3$) gas is reduced to "zero", the refractive index of the film thus obtained becomes the refractive index of $SiO_x$.

Hence, firstly, the first layer 13a with a refractive index n2 is formed by increasing the flow rate of ammonia ($NH_3$) gas within the flow rate of the entire source gases. Then, the second layer 13b with a refractive index that is smaller than the refractive index of the first layer 13a is formed by decreasing the flow rate of ammonia gas. After that, the third layer 13c is formed to have a refractive index that is smaller than the refractive index of the second layer 13b by further reducing the flow rate of ammonia gas.

The thickness of each layer is controlled by adjusting the length of the film forming time. Though the total film thickness of such a second insulation layer 13B depends on the thickness of the first insulation layer 17 to be coated, the total film thickness ranges from 1 μm to 3 μm, approximately. A second insulation layer 13B with a continuously changing refractive index from n2 is formed by changing the flow rate of ammonia ($NH_3$) gas with time. This method, however, makes more difficult the control of the film forming conditions and makes more difficult flexible operations such as stopping the film formation in the middle. Hence, in view of the productivity, the second insulation layer 13B may be formed to include a plurality of layers with different refractive indexes from one another as in the third exemplary embodiment.

In the subsequent second insulation layer planarization process of Step S09, as illustrated in FIG. 25, the second insulation layer 13B thus formed is planarized to expose the first insulation layer 17 in the non-opening region, and the second insulation layer 13B including the first layer 13a, the second layer 13b, and the third layer 13c with different refractive indexes from one another is formed to fill the recessed portions 12b in the opening regions.

Advantageous Improvement in Use Efficiency of Light

Figure 26:
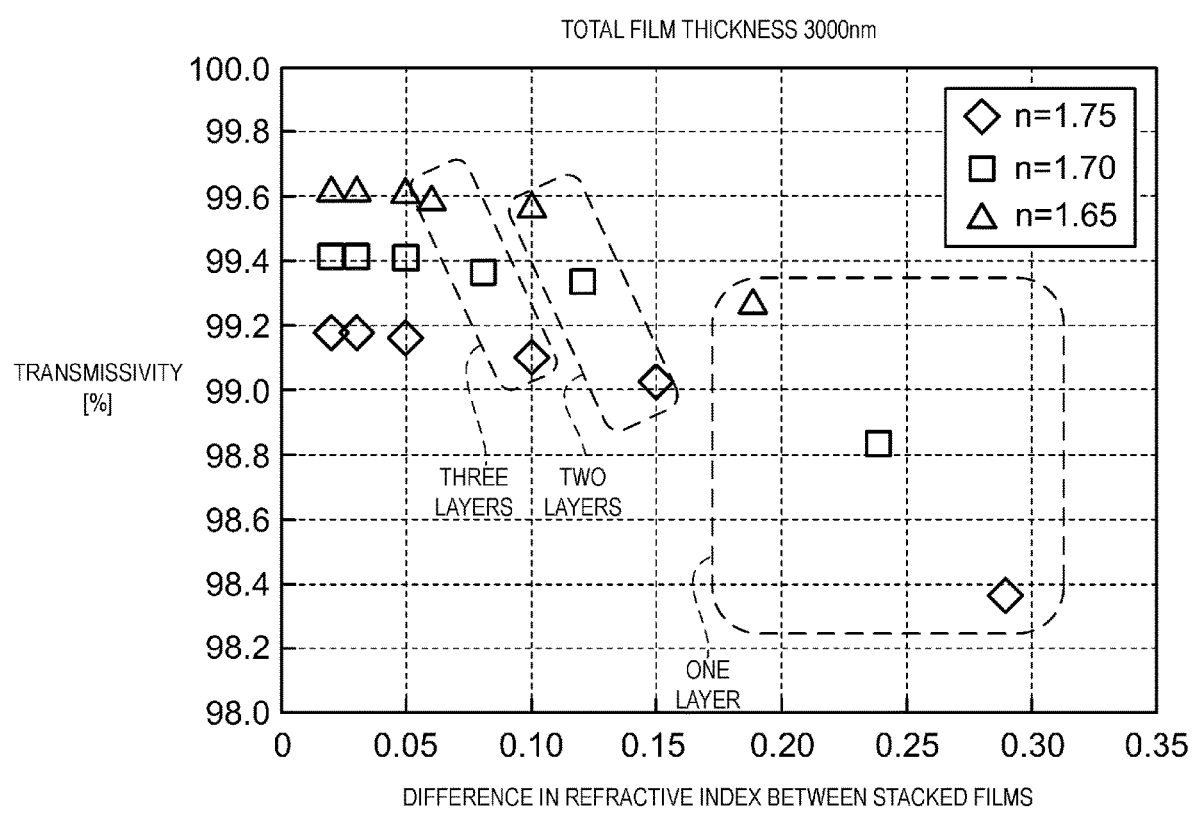
FIG. 26 is a graph illustrating the relationship between a configuration of a second insulation layer of the third exemplary embodiment and the light transmittance.

Next, the relationship between the configuration of the second insulation layer 13B of the third exemplary embodiment and the effect to improve efficiency of using light having entered the opening regions will be described by referring to FIG. 26. FIG. 26 is a graph illustrating the relationship between a configuration of a second insulation layer of the third exemplary embodiment and the light transmittance.

The graph of FIG. 26 illustrating the relationship between the configuration of the second insulation layer 13B and the light transmissivity is obtained by using a quartz substrate having a refractive index of 1.46 as the base substrate 10s and a silicon oxide film also having a refractive index of 1.46 as the third interlayer insulation film 14 that is stacked on top of the second insulation layer 13B, and performing an optical simulation to calculate the transmissivity in various cases of different configurations of the second insulation layer 13B. The second insulation layer 13B has a total thickness of 3000 nm in all the cases and the transmissivity is an average value for the light within the visible light wavelength range (from 400 nm to 800 nm).

Specifically, the transmissivity is calculated for a case where the second insulation layer 13 is a single layer (1 layer) as in the first exemplary embodiment. There are three different refractive indexes n: 1.65, 1.70, and 1.75. The difference in the refractive index between the second insulation layer 13 and the third interlayer insulation film 14 that is stacked on top of the second insulation layer 13 is: 0.19 when the second insulation layer 13 has a refractive index n=1.65, 0.24 when the second insulation layer 13 has a refractive index n=1.70, and 0.29 when the second insulation layer 13 has a refractive index n=1.75. This reveals that the transmissivity is improved as the refractive index of the second insulation layer 13 becomes smaller. Specifically, when n=1.65, the transmissivity is approximately 99.3%, when n=1.70, the transmissivity is approximately 98.8%, and when n=1.75, the transmissivity is approximately 98.4%.

Now the second insulation layer 13B has a two-layer structure including two layers with different refractive indexes from each other. Specifically, there are three different refractive indexes are provided to the first layer 13a as in the single-layer case and the film thickness is 2900 nm. The second layer 13b has a thickness of 100 nm. When the first layer 13a has a refractive index of 1.65, the second layer 13b has a refractive index of 1.55. In this case, the difference in the refractive index between the second layer 13b and the third interlayer insulation film 14 is 0.09. When the first layer 13a has a refractive index of 1.70, the second layer 13b has a refractive index of 1.58. In this case, the difference in the refractive index between the second layer 13b and the third interlayer insulation film 14 is 0.12. When the first layer 13a has a refractive index of 1.75, the second layer 13b has a refractive index of 1.61. In this case, the difference in the refractive index between the second layer 13b and the third interlayer insulation film 14 is 0.15.

This reveals that the transmissivity is improved as the refractive index of the second layer 13b becomes smaller. Specifically, when the first layer 13a has a refractive index n=1.65, the transmissivity is approximately 99.6%, when the first layer 13a has a refractive index n=1.70, the transmissivity is approximately 99.3%, and when the first layer 13a has a refractive index n=1.75, the transmissivity is approximately 99.0%. This reveals that the transmissivity is improved from the case of the single-layer second insulation layer 13 (having one layer) of the first exemplary embodiment.

Next, the second insulation layer 13B has a three-layer structure including three layers with different refractive indexes from one another as in the third exemplary embodiment. Specifically, there are three different refractive indexes are provided to the first layer 13a as in the single-layer case and the film thickness is 2800 nm. The thickness of the second layer 13b is 100 nm, and the thickness of the third layer 13c is also 100 nm. When the first layer 13a has a refractive index of 1.65, the second layer 13b has a refractive index of 1.58, and the third layer 13c has a refractive index of 1.52. In this case, the difference in the refractive index between the third layer 13c and the third interlayer insulation film 14 is 0.06.

When the first layer 13a has a refractive index of 1.70, the second layer 13b has a refractive index of 1.62, and the third layer 13c has a refractive index of 1.54. In this case, the difference in the refractive index between the third layer 13c and the third interlayer insulation film 14 is 0.08. When the first layer 13a has a refractive index of 1.75, the second layer 13b has a refractive index of 1.65, and the third layer 13c has a refractive index of 1.55. In this case, the difference in the refractive index between the third layer 13c and the third interlayer insulation film 14 is 0.09.

This reveals that the transmissivity is improved as the refractive index of the third layer 13c becomes smaller. Specifically, when the first layer 13a has a refractive index n=1.65, the transmissivity is approximately 99.6%, when the first layer 13a has a refractive index n=1.70, the transmissivity is approximately 99.4%, and when the first layer 13a has a refractive index n=1.75, the transmissivity is approximately 99.1%. This reveals that the transmissivity is improved, though slightly, from the case where the second insulation layer 13B includes two layers with different refractive indexes from each other.

Hereinafter, with a fixed total film thickness of 3000 nm, the transmissivities are calculated in a similar manner as described above by a simulation performed by increasing the number of layers with different refractive indexes from one another included in the second insulation layer 13B, and by adjusting the difference in the refractive index between any two layers adjacent to each other in the thickness direction to be 0.05 or smaller. The simulation is performed for the cases of 4 or more layers. In the cases of 4 or more layers, the transmissivity is slightly improved from the three-layer case on the higher refractive index side. Specifically, when the first layer 13a has a refractive index n=1.65, the transmissivity is approximately 99.6%, when the first layer 13a has a refractive index n=1.70, the transmissivity is approximately 99.4%, and when the first layer 13a has a refractive index n=1.75, the transmissivity is approximately 99.2%. This reveals that in the cases of 4 or more layers, the transmissivity levels off.

According to the results of transmissivity in FIG. 26, the transmissivity improves as the number of layers with different refractive indexes from one another included in the second insulation layer 13B increases. In addition, in the cases of 4 or more layers, the transmissivity levels off. When the transmissivity levels off, the difference in the refractive index between the two layers that are adjacent each other in the thickness direction is not larger than 0.05.

The transmissivity improves as the first layer 13a in the second insulation layer 13B has a smaller refractive index. The difference in the refractive index between the first layer 13a and the third interlayer insulation film 14 stacked on top of the second insulation layer 13B may be less than 0.2. On the other hand, to make the side walls 12a of the first insulation layer 17 reflect part of the light having entered the opening regions, according to Snell's law as described earlier, while the relationship of the refractive index n1<the refractive index n2 is maintained, the difference between the refractive index n1 of the first insulation layer 17 and the refractive index n2 of the first layer 13a in the second insulation layer 13B may be increased and the critical angle θc may be decreased. Hence, the difference between the refractive index n1 of the first insulation layer and the refractive index n2 of the first layer 13a may be not smaller than 0.1.

More specifically, both the refractive index of the first insulation layer and the refractive index of the third interlayer insulation film 14 may be 1.46, the refractive index n2 of the first layer 13a may be at least 1.75, and the number of layers included in the second insulation layer 13 may be at least 2. When the number of layers included in the second insulation layer 13B is at least 2, the difference in the refractive index between two layers adjacent to each other in the thickness direction may preferably be as small as possible, but may substantially range from 0.05 to 0.15 by taking the productivity into consideration.

According to the configuration of and the method for producing the element substrate 10B of the liquid crystal panel 110B of the third exemplary embodiment, as the second insulation layer 13B includes a layer with a refractive index that decreases with the thickness-direction distance from the base substrate 10s (i.e., the second layer 13b, and the third layer 13c), the reflection of the light having entered the opening regions on the interface between the third interlayer insulation film 14 and the second insulation layer 13B is reduced. As a result, compared to the first exemplary embodiment, the incident light is used effectively and thus the liquid crystal device 100 having a bright and excellent display quality is provided or produced.

Fourth Exemplary Embodiment

Electronic Equipment

Figure 27:
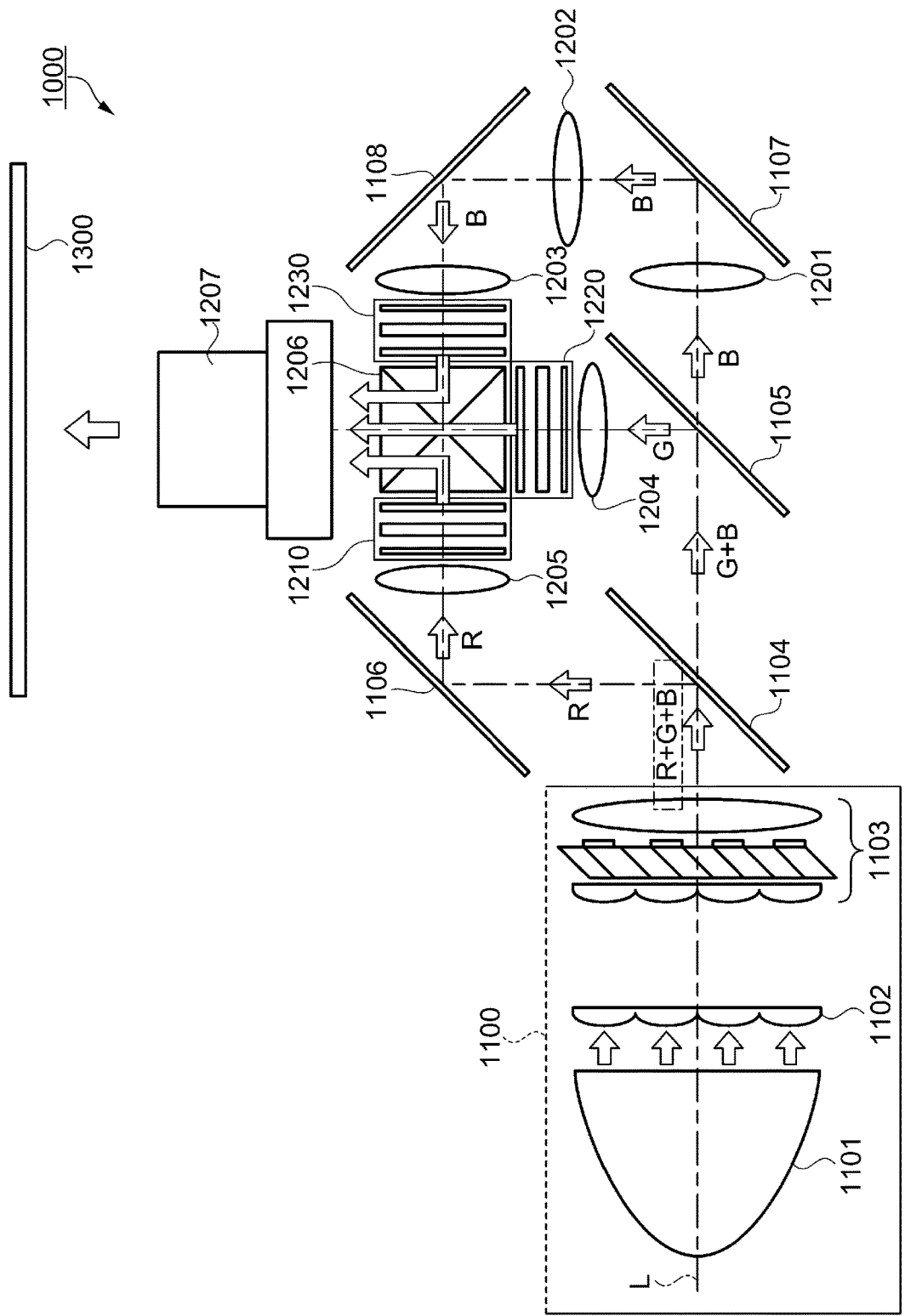
FIG. 27 is a schematic diagram illustrating a configuration of a projection-type display apparatus as electronic equipment of the fourth exemplary embodiment.

Next, a projection type display apparatus is picked up as an example of electronic equipment of a fourth exemplary embodiment, and thus will be described below. FIG. 27 is a schematic diagram illustrating a configuration of a projection type display apparatus as electronic equipment of the fourth exemplary embodiment.

As illustrated in FIG. 27, a projection type display apparatus 1000 as an example of electronic equipment of the fourth exemplary embodiment includes a polarizing illuminator 1100 disposed along the system optical axis L, two dichroic mirrors 1104 and 1105 as light splitting elements, three reflecting mirrors 1106, 1107, and 1108, five relay lenses 1201, 1202, 1203, 1204, and 1205, liquid crystal light valves of a transmissive type 1210, 1220, and 1230 as three optical modulation devices, a cross dichroic prism 1206 as a light-synthesizing element, and a projector lens 1207.

The polarizing illuminator 1100 generally includes a lamp unit 1101 serving as a light source including a white light source such as an ultra high pressure mercury lamp and a halogen lamp, an integrator lens 1102, and a polarization converting element 1103.

The dichroic mirror 1104 reflects the red light (R) of the polarized beams having exited from the polarizing illuminator 1100, and allows the green light (G) and the blue light (B) to pass through the dichroic mirror 1104 itself. The other dichroic mirror 1105 reflects the green light (G) that has passed through the dichroic mirror 1104 and allows the blue light (B) to pass through the dichroic mirror 1105 itself.

The red light (R) having been reflected on the dichroic mirror 1104 is reflected on the reflecting mirror 1106, then passes through the relay lens 1205, and enters the liquid crystal light valve 1210. The green light (G) having been reflected on the dichroic mirror 1105 passes through the relay lens 1204 and then enters the liquid crystal light valve 1220. The blue light (B) having passed through the dichroic mirror 1105 passes through the light guiding system including three relay lenses 1201, 1202, and 1203 and two reflecting mirrors 1107 and 1108, and then enters the liquid crystal light valve 1230.

The liquid crystal light valves 1210, 1220, and 1230 are disposed opposite respectively to the incidence planes for the individual color lights of the cross dichroic prism 1206. The color lights having entered the liquid crystal light valves 1210, 1220, and 1230 are modulated based on the video information (video signals) and then exit towards the cross dichroic prism 1206. This prism is formed by bonding four rectangular prisms together, and in its inner surfaces, a multiple layer dielectric film to reflect the red color light and a multiple layer dielectric film to reflect the blue color light are formed in a cross shape. These multiple layer dielectric films synthesize the three color lights to create the lights to display a color image. The synthesized light is projected onto a screen 1300 by means of the projector lens 1207 serving as a projecting optical system and an enlarged image is displayed.

The liquid crystal light valve 1210 employs the liquid crystal device 100 of some embodiments described above. On the color light entry side and the color light exit side of the liquid crystal panel 110, 110A, or 110B, a pair of polarizing elements are disposed in a cross-nicol alignment with a certain gap between the two elements. The other liquid crystal light valves 1220 and 1230 are similar to the liquid crystal light valve 1210.

According to such a projection type display apparatus 1000, the above-described liquid crystal device 100 is used as the liquid crystal light valves 1210, 1220, and 1230, and thus a bright display and a high contrast are accomplished. Hence, a projection type display apparatus 1000 with an excellent display quality is provided.

The disclosure is not limited to the above-described some exemplary embodiments, and may be altered appropriately within a range of the gist or the idea of the disclosure that is read from the claims and the entire specification. The electro-optic devices altered as such and the electronic equipment employing the altered electro-optic device are also within the technical range of the disclosure. Various modification examples are conceivable beside the above-described several exemplary embodiments. Hereinafter such modification examples will be described.

Modification Example 1

The structures of the element substrates 10, 10A, and 10B are not limited to the structures in the above-described the first exemplary embodiment to the third exemplary embodiment. The first light-shielding layer disposed in the non-opening regions is not limited to the scanning lines 3, but may be a simple light-shielding layer, for example. In addition, the second light-shielding layer disposed above the TFTs 30 is not limited to the data lines 6 positioned immediately above the TFTs 30. To block the light to enter the TFTs 30, a wiring layer that is located on the light entry side for the light entering the TFTs 30 and that is as remote as possible from the TFTs 30 may be used as the second light-shielding layer.

Modification Example 2

Figure 28:
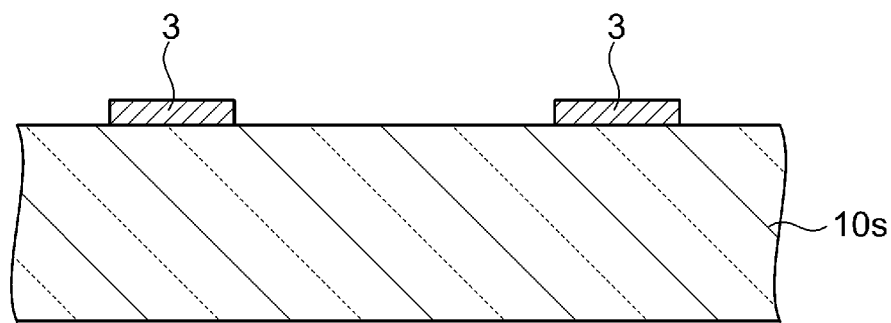
FIG. 28 is a schematic cross-sectional diagram illustrating a method for producing an element substrate of a modification example 2.
Figure 29:
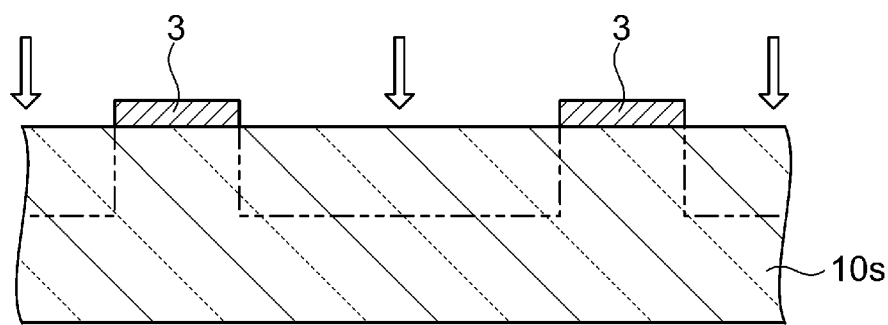
FIG. 29 is a schematic cross-sectional diagram illustrating a method for producing the element substrate of the modification example 2.
Figure 30:
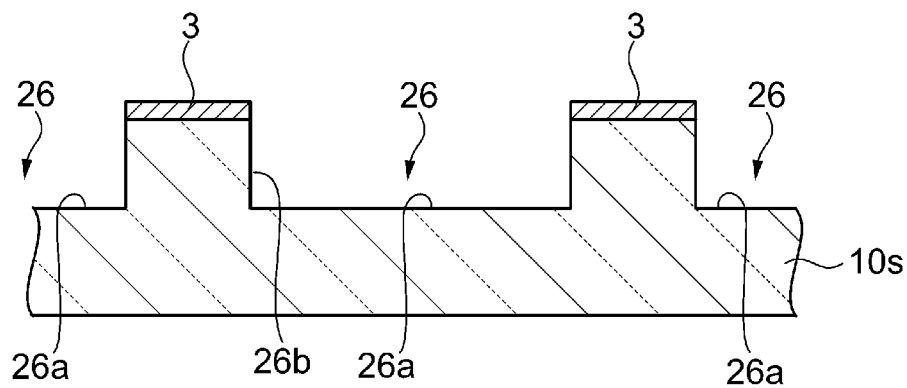
FIG. 30 is a schematic cross-sectional diagram illustrating a method for producing the element substrate of the modification example 2.

Methods for producing the element substrate 10, 10A, and 10B are not limited to the method including forming the recessed portions 26 in Step S01 of the above-described the first exemplary embodiment to the third exemplary embodiment, and then forming, in Step S02, the scanning lines 3 serving as the first light-shielding layer. FIG. 28 to FIG. 30 are schematic cross-sectional diagrams illustrating a method for producing an element substrate of a modification example 2. For example, the first light-shielding layer (scanning lines 3) is formed as illustrated in FIG. 28, and then by using the first light-shielding layer (scanning lines 3) as a metal mask the base substrate 10s (or the insulation layer 19) may be etched anisotropically as illustrated in FIG. 29. In other words, the metal mask used in the process for forming the recessed portions 26 may be used as the first light-shielding layer (scanning lines 3).

By doing in this way, the recessed portions 26 are formed in the opening regions surrounded by the non-opening regions where the first light-shielding layer (scanning lines 3) is disposed as illustrated in FIG. 30. Hence the alignment accuracy between the first light-shielding layer and the recessed portions 26 is improved furthermore. The etching to form the recessed portions 26 reduces the thickness of the first light-shielding layer. Hence, to secure the intended thickness of the first light-shielding layer after the formation of the recessed portions 26, the thickness of the first light-shielding layer formed earlier may be adjusted to correspond to the etching conditions including the selection ratio between the first light-shielding layer and the base substrate 10s (or the insulation layer 19).

Modification Example 3

The electronic equipment that employs the liquid crystal device 100 of the above-described the first exemplary embodiment to the third exemplary embodiment is not limited to the projection type display apparatus 1000 of the above-described fourth exemplary embodiment. For example, with a configuration of the liquid crystal device including a color filter with a coloring layer in a pixel, the liquid crystal device may be used as a display portion in a projector type head-up display (HUD), a direct viewing type head mount display (HMD), an e-book, a personal computer, a digital still camera, a liquid crystal display television, a view finder type or a monitor direct viewing type video recorder, a car navigation system, an information terminal device such as an electronic organizer, POS, etc.

The entire disclosure of Japanese Patent Application No. 2017-146255, filed Jul. 28, 2017 is expressly incorporated by reference herein.

What is claimed is:

1. An electro-optic device comprising:
   a recessed portion provided in a pixel in a base substrate;
   a first light-shielding layer and a second light-shielding layer provided on the base substrate, the first light-shielding layer and the second light-shielding layer being disposed sequentially from a base substrate side in a thickness direction of the base substrate with a space between the first light-shielding layer and the second light-shielding layer;
   a transistor provided between the first light-shielding layer and the second light-shielding layer;
   a first insulation layer including a layer that covers the second light-shielding layer and is disposed along the recessed portion to define a side wall of the recessed portion; and
   a second insulation layer being provided in the recessed portion to be in contact with the first insulation layer that defines the side wall of the recessed portion, and having a refractive index that is higher than a refractive index of the first insulation layer, wherein
   a film thickness of the first insulation layer at a side portion of the recessed portion is equal to or smaller than a film thickness of the first insulation layer at a bottom portion of the recessed portion.

2. The electro-optic device according to claim 1, wherein a bottom portion of the second insulation layer is provided on the base substrate side of the first light-shielding layer.

3. The electro-optic device according to claim 1, wherein the second insulation layer includes a layer having a refractive index that decreases in a stepwise manner according to a distance from the base substrate in a thickness direction.

4. Electronic equipment comprising the electro-optic device of claim 1.

5. An electro-optic device comprising:
   a recessed portion provided in a pixel in a base substrate;
   a first light-shielding layer and a second light-shielding layer provided on the base substrate, the first light-shielding layer and the second light-shielding layer being disposed sequentially from a base substrate side in a thickness direction of the base substrate with a space between the first light-shielding layer and the second light-shielding layer;
   a transistor provided between the first light-shielding layer and the second light-shielding layer;
   a first insulation layer including a layer that covers the second light-shielding layer and is disposed along the recessed portion to define a side wall of the recessed portion; and
   a second insulation layer being provided in the recessed portion to be in contact with the first insulation layer that defines the side wall of the recessed portion, and having a refractive index that is higher than a refractive index of the first insulation layer, wherein
   the second insulation layer includes a layer having a refractive index that decreases in a stepwise manner according to a distance from the base substrate in a thickness direction.

* * * * *